United States Patent
Groeneveld et al.

(10) Patent No.: US 6,230,304 B1
(45) Date of Patent: May 8, 2001

(54) METHOD OF DESIGNING A CONSTRAINT-DRIVEN INTEGRATED CIRCUIT LAYOUT

(75) Inventors: Patrick R. Groeneveld; Lukas P. P. P. van Ginneken, both of San Jose, CA (US)

(73) Assignee: Magma Design Automation, Inc., Cupertino, CA (US)

( * ) Notice: Subject to any disclaimer, the term of this patent is extended or adjusted under 35 U.S.C. 154(b) by 0 days.

(21) Appl. No.: 09/054,319

(22) Filed: Apr. 2, 1998

Related U.S. Application Data
(60) Provisional application No. 60/068,827, filed on Dec. 24, 1997.

(51) Int. Cl.[7] .................................................... G06F 17/50
(52) U.S. Cl. .................................................................. 716/7
(58) Field of Search ........................................... 716/9, 18

(56) References Cited

U.S. PATENT DOCUMENTS

| | | |
|---|---|---|
| 4,484,292 | 11/1984 | Hong et al. . |
| 4,615,011 | 9/1986 | Linsker . |

(List continued on next page.)

FOREIGN PATENT DOCUMENTS

| | | | |
|---|---|---|---|
| 0677813 | 10/1995 | (EP) | ................................ G06F/17/50 |

OTHER PUBLICATIONS

M. Pedram, "Logical–Physical Co–Design for Deep Submicron Circuits: Challenges and Solutions", Proceedings of the ASP–DAC '98 Asian and S. Pacific, Design Automation Conference 1998, pp. 137–142.

T. Xue et al., "Post Global Routing Crosstalk Synthesis", IEEE, vol. 16, No. 12, Dec. 1997, pp. 1418–1430.

T. Koide et al., "A Timing–Driven Global Routing Alogrithm With Pin Assignment, Block Reshaping, and Positioning for Building Block Layout", Proceedings of the ASP–DAC '98 Asian and S. Pacific, Design Automation Conference, 1998, pp. 577–583.

S–Y Oh et al., "A Scaling Scheme and Optimization Methodology for Deep Sub–Micron Interconnect", Proceedings of the International Conference on Computer Design, ICC VLSI, Oct. 1996, pp. 320–325.

Groeneveld, Patrick: "Context–driven Channel Routing," Ph.D. Dissertation, Delft University of Technology, Delft, The Netherlands, Jun. 1991.

Internet Publication http://www.isdmag.com/Editorial/1997/Editorial9704.html.

Internet Publication http://www.isdmag.com/EEdesign/FocusReport9706.html.

Internet Publication http://virtual.union.edu/~templej/lab3/index.html.

(List continued on next page.)

Primary Examiner—Matthew Smith
Assistant Examiner—Thuan Do
(74) Attorney, Agent, or Firm—Pillsbury Winthrop LLP

(57) ABSTRACT

An automated method for designing an integrated circuit layout with a computer, based upon an electronic circuit description and upon a selected plurality of cells from a cell library, comprising the steps of: (a) assigning each of the cells to one of a plurality of buckets designated on the integrated circuit layout, each of the cells being connected to one of the other cells; (b) performing global routing to connect at least some of the selected cells of step (a) together such that global routes are formed to provide net topology information; (c) performing track routing which sets the position of each of the global routes; (d) performing detailed placement such that the positions of all selected cells are fixed within each of the buckets designated on the integrated circuit layout; and (e) performing detailed routing such that detailed routes are formed to complete the integrated circuit layout.

86 Claims, 21 Drawing Sheets

U.S. PATENT DOCUMENTS

| | | | |
|---|---|---|---|
| 4,949,275 | 8/1990 | Nonaka . | |
| 5,046,017 | 9/1991 | Yuyama et al. | 364/491 |
| 5,047,949 | 9/1991 | Yamaguchi et al. . | |
| 5,065,355 | 11/1991 | Hayase . | |
| 5,072,402 | 12/1991 | Ashtaputre et al. . | |
| 5,191,542 | 3/1993 | Murofushi | 364/491 |
| 5,245,550 | 9/1993 | Miki et al. . | |
| 5,249,134 | 9/1993 | Oka . | |
| 5,341,310 | 8/1994 | Gould et al. . | |
| 5,361,214 | 11/1994 | Aoki . | |
| 5,394,337 | 2/1995 | Shinjo . | |
| 5,404,312 | 4/1995 | Tawada . | |
| 5,452,239 | 9/1995 | Dai et al. . | |
| 5,461,576 | 10/1995 | Tsay et al. | 364/490 |
| 5,471,398 | 11/1995 | Stephens . | |
| 5,483,461 | 1/1996 | Lee et al. . | |
| 5,485,396 | 1/1996 | Brasen et al. . | |
| 5,537,330 | 7/1996 | Damiano et al. . | |
| 5,590,050 | 12/1996 | Okuda . | |
| 5,598,347 | 1/1997 | Iwasaki . | |
| 5,625,568 | 4/1997 | Edwards et al. . | |
| 5,629,860 | 5/1997 | Jones et al. | 364/490 |
| 5,633,806 | 5/1997 | Yusa et al. . | |
| 5,636,129 | 6/1997 | Her . | |
| 5,638,288 | 6/1997 | Deeley . | |
| 5,649,170 | 7/1997 | Chappell et al. | 395/500 |
| 5,654,898 | 8/1997 | Roetcisoender et al. . | |
| 5,657,241 | 8/1997 | Butts et al. . | |
| 5,657,242 | 8/1997 | Sekiyama et al. . | |
| 5,663,892 | 9/1997 | Hayashi et al. . | |
| 5,666,288 | 9/1997 | Jones et al. . | |
| 5,675,501 | 10/1997 | Aoki . | |
| 5,682,323 | 10/1997 | Pasch et al. . | |
| 5,689,433 | 11/1997 | Edwards . | |
| 5,715,171 | 2/1998 | Mori et al. . | |
| 5,729,469 | 3/1998 | Kawakami . | |
| 5,737,237 | 4/1998 | Tanaka et al. . | |
| 5,745,373 | 4/1998 | Watai et al. . | |
| 5,757,658 | 5/1998 | Rodman et al. . | |
| 5,761,078 | 6/1998 | Fuller et al. . | |
| 5,764,525 | 6/1998 | Mahmood et al. . | |
| 5,764,530 | 6/1998 | Yokomaku . | |
| 5,764,532 | 6/1998 | Patel . | |
| 5,764,534 | 6/1998 | Goetting . | |
| 5,768,146 | 6/1998 | Jassawski . | |
| 5,774,371 | 6/1998 | Kawakami . | |
| 5,778,216 | 7/1998 | Venkatesh . | |
| 5,838,583 * | 11/1998 | Varadarajan | 716/9 |
| 6,102,964 * | 8/2000 | Tse | 716/18 |

OTHER PUBLICATIONS

Internet Publication http://virtual.edu/~temple/lab3/k_map-s.html.

Internet Publication http://virtual.union.edu/~templej/lab3/counter.html.

Internet Publication http://virtual.union.edu/~templej/lab3/counter_ledit.html.

Internet Publication http://virtual.union.edu/~templej/lab3/counter_wave.html.

Internet Publication http://www.cadence.com/features/DSM.html.

Internet Publication http://www.isdmag.com/Editorial/1997/EDAambitFeature9706.html.

* cited by examiner

HIERARCHICAL MODEL ASSOCIATED IN A GIVEN BUCKET

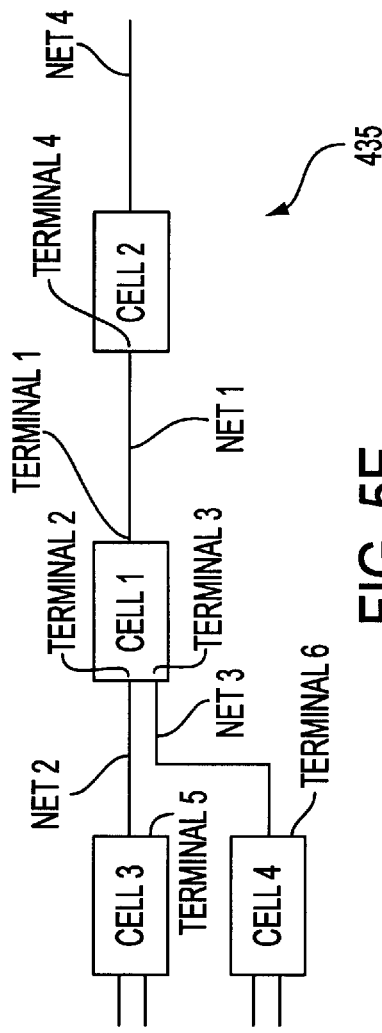

| SELECTED CELLS | NETS | PINS (CELL TERMINALS) | CELL SIZES | NET LENGTHS | NET WEIGHT | NET CAPACITANCE | CELL & MODULE ASSOCIATIONS |
|---|---|---|---|---|---|---|---|
| CELL 1 | NET 1 | TERMINAL 1 | SIZE OF CELL 1 | LENGTH OF NET 1 | WEIGHT OF NET 1 | CAPACITANCE OF NET 1 | MODULE 386 (FIG. 5A) |
| CELL 2 | NET 1 | TERMINAL 4 | | | | | MODULE 388 (FIG. 5A) |
| CELL 3 | NET 2 | TERMINAL 5 | | | | | |
| CELL 4 | NET 3 | TERMINAL 6 | | | | | |
| • • | • • | • • | • • | • • | • • | • • | • • |
| CELL n | NET m | TERMINAL y | SIZE OF CELL n | LENGTH OF NET m | WEIGHT OF NET m | CAPACITANCE OF NET m | MODULE X |

DATABASE 430

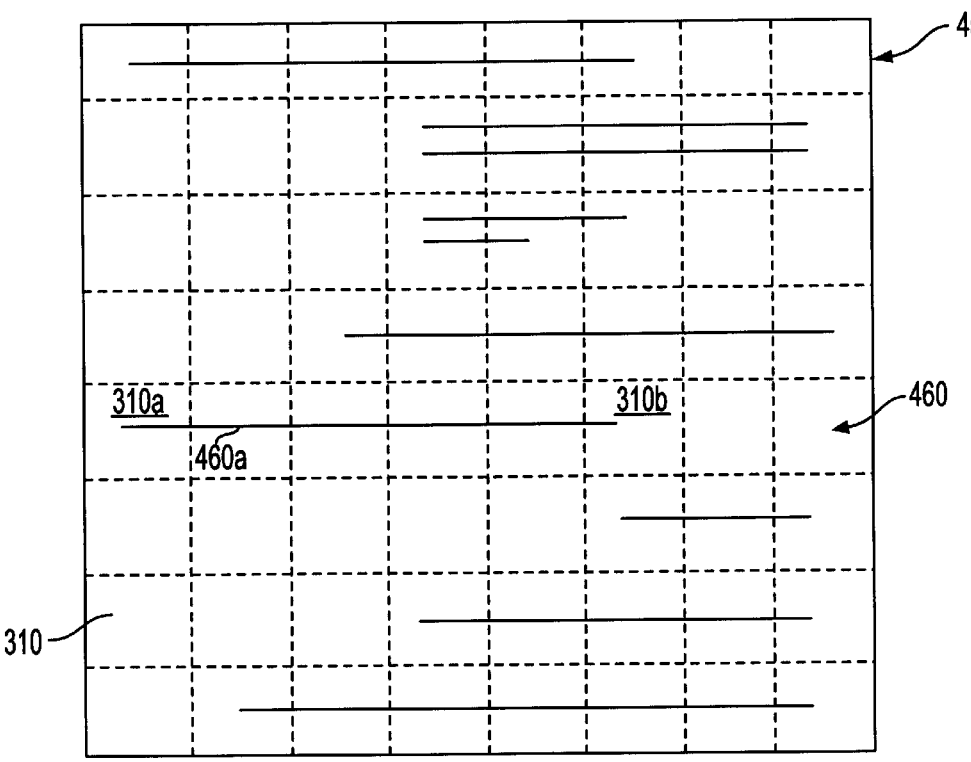
FIG. 6A METAL-1 LAYER 1
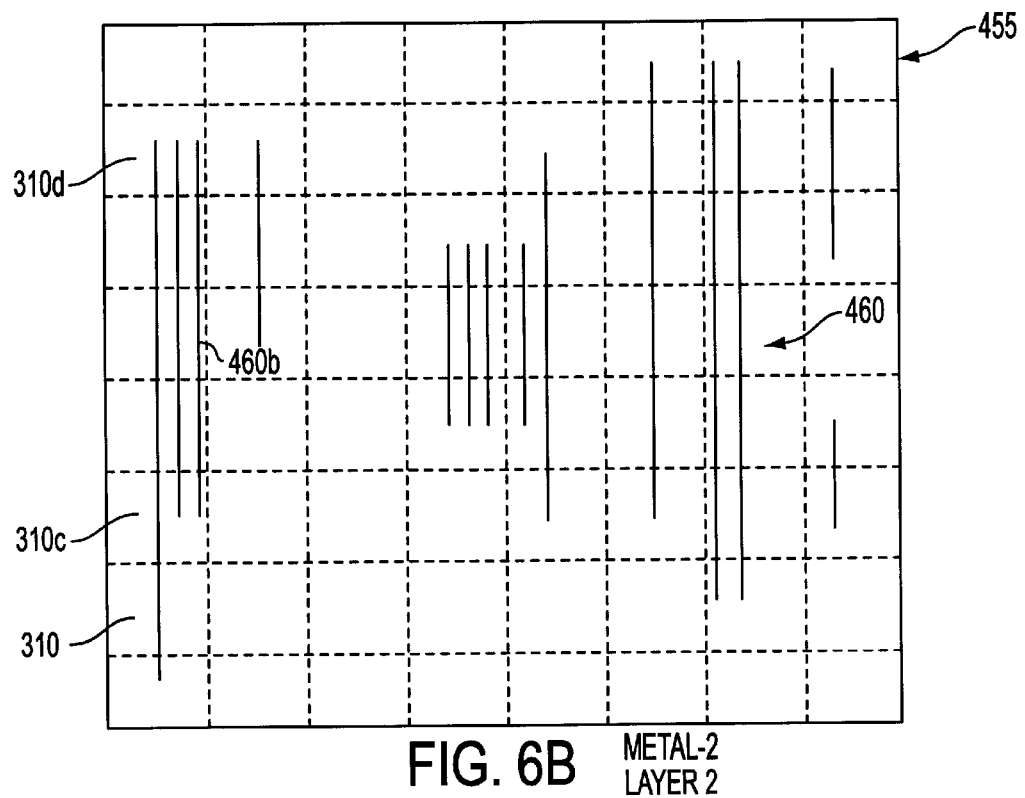
FIG. 6B METAL-2 LAYER 2

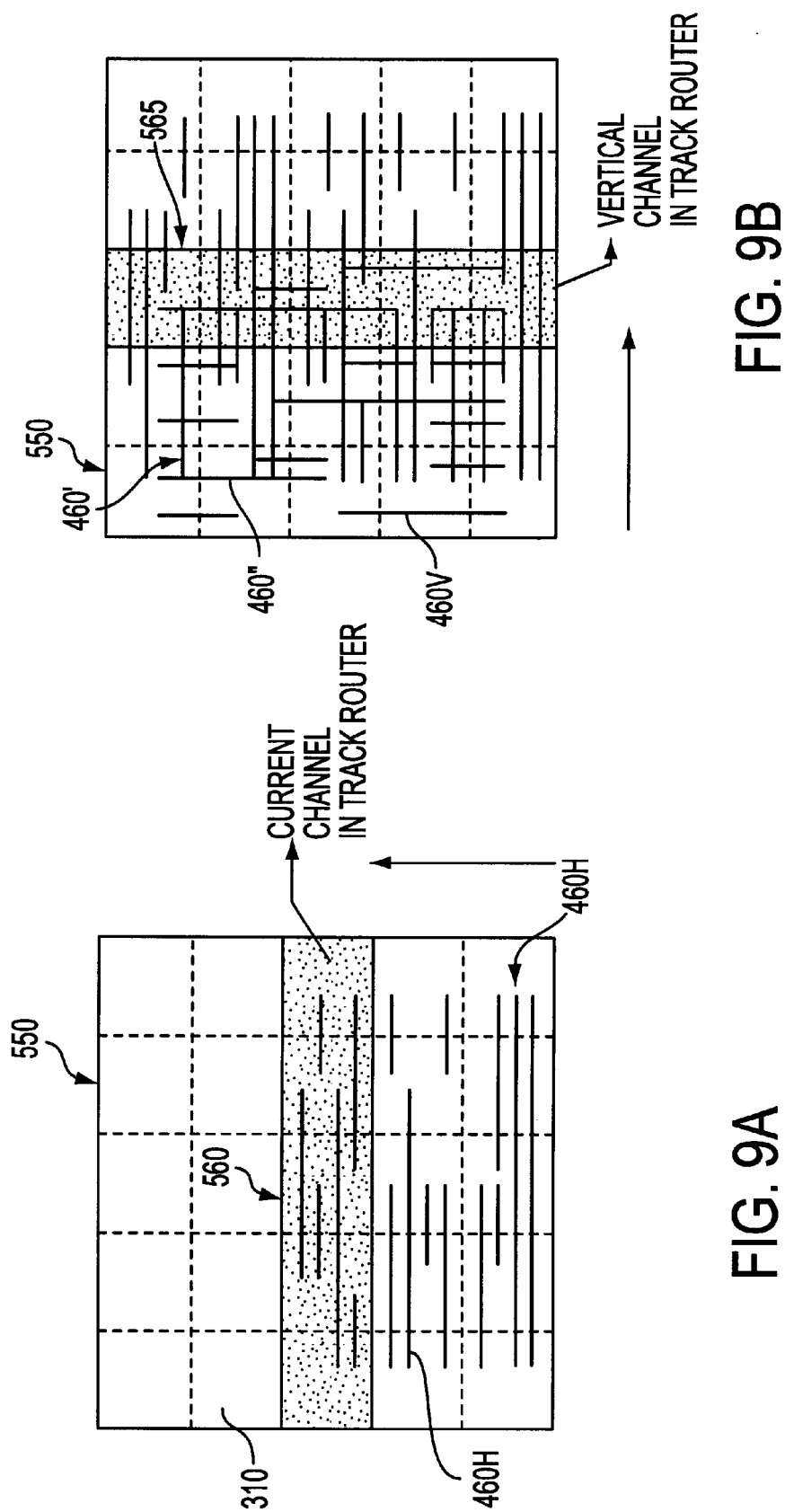

TRACK ROUTER WORKING ON A CHANNEL

ILLUSTRATION: CREATING EXTRA AREA BY ENLARGING ALL BUCKETS IN A ROW.

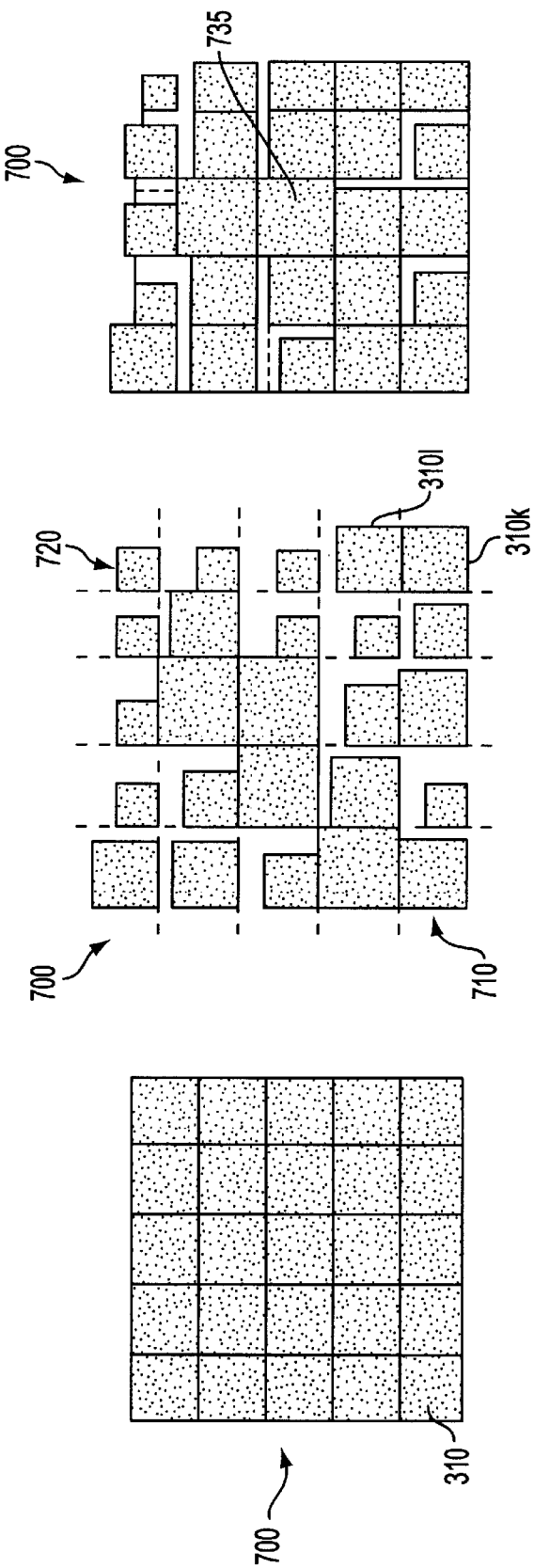

ILLUSTRATION OF THE EFFECT OF BUCKET EQUALIZATION
FIG. 12C

EQUALIZATION MOVES OVERFLOW CELLS TO NEIGHBORING CELLS IN AN ATTEMPT TO MINIMIZE THE CRITICAL PATH.

ILLUSTRATION OF THE EFFECT OF BUCKET EQUALIZATION
FIG. 12B

RE-OPTIMIZATION AND GLOBAL ROUTING CHANGES THE SIZE OF EACH OF THE BUCKETS SOMEWHAT, ENLARGING THE CIRCUIT.

ILLUSTRATION OF THE EFFECT OF BUCKET EQUALIZATION
FIG. 12A

INITIALLY THE BUCKETS ARE FILLED BY THE COARSE PLACER SUCH THAT THEIR SIZES ARE EQUAL.

A SINGLE BUCKET WITH STANDARD CELLS OVERLAPPING.

SNAPSHOT OF A ROUTING GRID AT THE INTERSECTION OF TWO TEAR LINES. THE ROUTING GRID AT TEAR LINE IS SPARSE. THE DOTS REPRESENT THE NODES IN THE GRID GRAPH. HORIZONTAL AND VERTICAL EDGES REPRESENT WIRE SEGMENTS. EDGES IN THE Z-DIRECTION REPRESENT VIA'S.

METHOD OF DESIGNING A CONSTRAINT-DRIVEN INTEGRATED CIRCUIT LAYOUT

RELATED PATENT APPLICATION

This application claims the benefit of U.S. Provisional Application No. 60/068,827 filed Dec. 24, 1997. This patent application is commonly owned with the following co-pending related U.S. Patent Application entitled, "Timing Closure Methodology," filed concurrently herewith and fully incorporated herein by reference.

FIELD OF THE INVENTION

This invention relates generally to the field of integrated circuit design and more specifically to a method for routing the interconnections between components on an integrated circuit.

BACKGROUND OF THE INVENTION

A cell-based integrated circuit is formed by selecting a plurality of cells that represent components having different characteristics from one or more cell libraries, determining interconnects for the selected cells, and then placing and routing the interconnected selected cells to form the integrated circuit. For example, groups of cells may be interconnected to function as flip-flops, shift registers and the like. This process, overall, is conventionally described in terms of logic description, synthesis of that logic, and then placement and routing of the synthesized logic.

Electrical connections of individual components on integrated circuits are achieved using conducting paths (also called "wires" or "nets") between terminals of components which are to be connected. Automatic routing schemes are used to determine these conducting paths.

For more complex designs, there are typically at least four distinct layers of conducting medium available for routing, such as a polysilicon layer and three metal layers (metal-1, metal-2, and metal-3). The polysilicon layer, metal-1, metal-2, and metal-3 are all used for vertical and/or horizontal routing. It is a common practice to route each conducting path ("wire" or "net") by using one or more of the distinct layers of conducting medium, with one layer of a pair being reserved predominantly for connections running along the "x" direction and the other layer for connections running in the orthogonal or "y" direction. Some of the layers, such as the metal layers, are exclusively used for interconnection of components. The polysilicon layer may have a dual role, such as forming the gates of transistors as well as for interconnection of components.

An electrical connection between two nets on adjacent layers is implemented with a "via" which is an etched or drilled hole in the substrate for allowing a conductive path to extend from one layer to another layer.

Conventional design methodologies typically use a two-step process for determining the final size and location of each net. The first step is the global routing step for roughly determining wiring routes. The "rough" wiring pattern generated in this step is known as a "global route." Subsequently, a second detailed routing step for precisely determining a final routing pattern according to the global routes is used. This final routing pattern determined by the detailed routing step is known as a "detailed route."

In one conventional design methodology, die size is fixed and imaginary grid lines are used to partition the die into a matrix of blocks. Thus, the grid lines are used by the automated place and route equipment to assist in determining and then tracking of the location of the various nets and components that make up the integrated circuit.

With conventional "fixed die" design methodologies, complete routing of all nets cannot be ensured. Although complete routing can be ensured using channel routing techniques, channel routing techniques impose additional constraints and have their own problems.

Co-pending related U.S. Patent Application entitled "Timing Closure Methodology," which is fully incorporated herein by reference, describes a timing driven methodology, which methodology makes timing, but not area, a constraint. Accordingly, once placement of cells is determined based upon timing that has been fixed, the need exists to more efficiently route wires. Conventional routing techniques, including those mentioned above, can be used to route wires and connect cells whose placement has been determined by use of the timing driven methodology described above. However, conventional routing methodologies cannot efficiently ensure that the timing constraints are maintained. Accordingly, there is a need for a new routing method that works with the timing driven design methodology to provide more efficient and better results.

SUMMARY OF THE INVENTION

The invention broadly provides an automated method for designing an integrated circuit layout with a computer, based upon an electronic circuit description and upon a selected plurality of cells from a cell library, comprising the steps of:

(a) assigning each of the cells to one of a plurality of buckets designated on the integrated circuit layout, each of the cells being connected to one of the other cells;

(b) performing global routing to connect at least some of the selected cells of step (a) together such that global routes are formed to provide net topology information;

(c) performing track routing which sets the position of each of the global routes;

(d) performing detailed placement such that the positions of all selected cells are fixed within each of the buckets designated on the integrated circuit layout; and (e) performing detailed routing such that detailed routes are formed to complete the integrated circuit layout.

The invention further provides an automated method for designing an integrated circuit layout with a computer, based upon an electronic circuit description and by using a cell library containing a selected plurality of cells, comprising the steps of:

(a) based upon a portion of a computer program that contains a sequence of instructions, assigning each of the cells to one of a plurality of buckets designated on the integrated circuit layout, each of the cells being connected to one of the other cells based upon the electronic circuit description input to the computer;

(b) performing global routing to connect at least some of the selected cells of step (a) together such that global routes are formed to provide net topology information;

(c) performing track routing which sets the position of each of the global routes;

(d) performing detailed placement such that the positions of all selected cells are fixed within each of the buckets designated on the integrated circuit layout; and (e) performing detailed routing such that detailed routes are formed to complete the integrated circuit layout.

A automated method for designing an integrated circuit layout by using a computer and based upon an electronic circuit description, comprising the steps of:

(a) using a portion of a computer program that contains a sequence of instructions, placing a first plurality of cells in designated initial positions;

(b) forming a plurality of global routes based upon the designated initial positions of the first plurality of cells of step (a);

(c) fixing the positions of the global routes of step (b);

(d) placing a second plurality of cells based upon the positions of the global routes of step (c); and (e) placing a plurality of detailed routes to complete the integrated circuit layout.

The present invention makes possible an advantage of providing a methodology for setting and achieving timing constraints for an-integrated circuit.

The invention also makes possible an advantage of providing a method to efficiently place cells and route wires based on fixed timing constraints for the desired circuit.

The invention further places timing driven routing at selected stages in the design process so as to optimize routing and placement results. The placement and routing results are further optimized since detailed placement is adapted based on the fixed positions of the.global routes.

The invention makes possible another advantage of enabling a faster process at later stages of the design process.

The invention makes possible an additional advantage of permitting capacitance control on a net-per-net basis which can lead to reduced die sizes.

Still another advantage made possible by the invention is the achievement of routing completion for an integrated circuit layout under constraints (e.g., timing constraints).

The invention also make possible an advantage of enabling detailed placement to be re-performed so as to achieve routing completion for the desired circuit.

The list of possible advantages and benefits above is not necessarily exhaustive.

BRIEF DESCRIPTION OF THE DRAWINGS

FIG. 5D is a database representation which contains parameters and component information which are used with the computer system of FIG. 1 for designing an integrated circuit layout in accordance with the present invention;

FIG. 5E is partial schematic diagram of a circuit which can be designed based on the parameters and component information stored and manipulated in the database representation of FIG. 5D;

FIG. 6A is a partial top elevational view of a first interconnection layer image to be formed in the semiconductor die wherein the image includes horizontal global routes;

FIG. 6B is a partial top elevational view of a second interconnection layer image to be formed in the semiconductor die wherein the image includes vertical global routes;

FIG. 9A is a partial top elevational view of an interconnection layer image as shown during a horizontal track routing step;

FIG. 9B is a partial top elevational view of an interconnection layer image as shown during a vertical track routing step;

FIG. 12A is a partial top elevational view of an interconnection layer image having equal sized buckets;

FIG. 12B is a partial top elevational view of the interconnection layer image of FIG. 12A after optimization and track routing change the size of each of the buckets, thereby enlarging the size of the desired circuit;

FIG. 12C is a partial top elevational view of the interconnection layer image of FIG. 12B after bucket equalization is performed, whereby overflow cells are moved adjacent to neighboring cells in an attempt to minimize critical areas (which impact the size of the circuit);

DETAILED DESCRIPTION OF THE INVENTION

Those of ordinary skill in the art will realize that the following description of the present invention is illustrative only and not in any way limiting. Other embodiments of the invention will readily suggest themselves to those skilled in the art.

Figure 1:
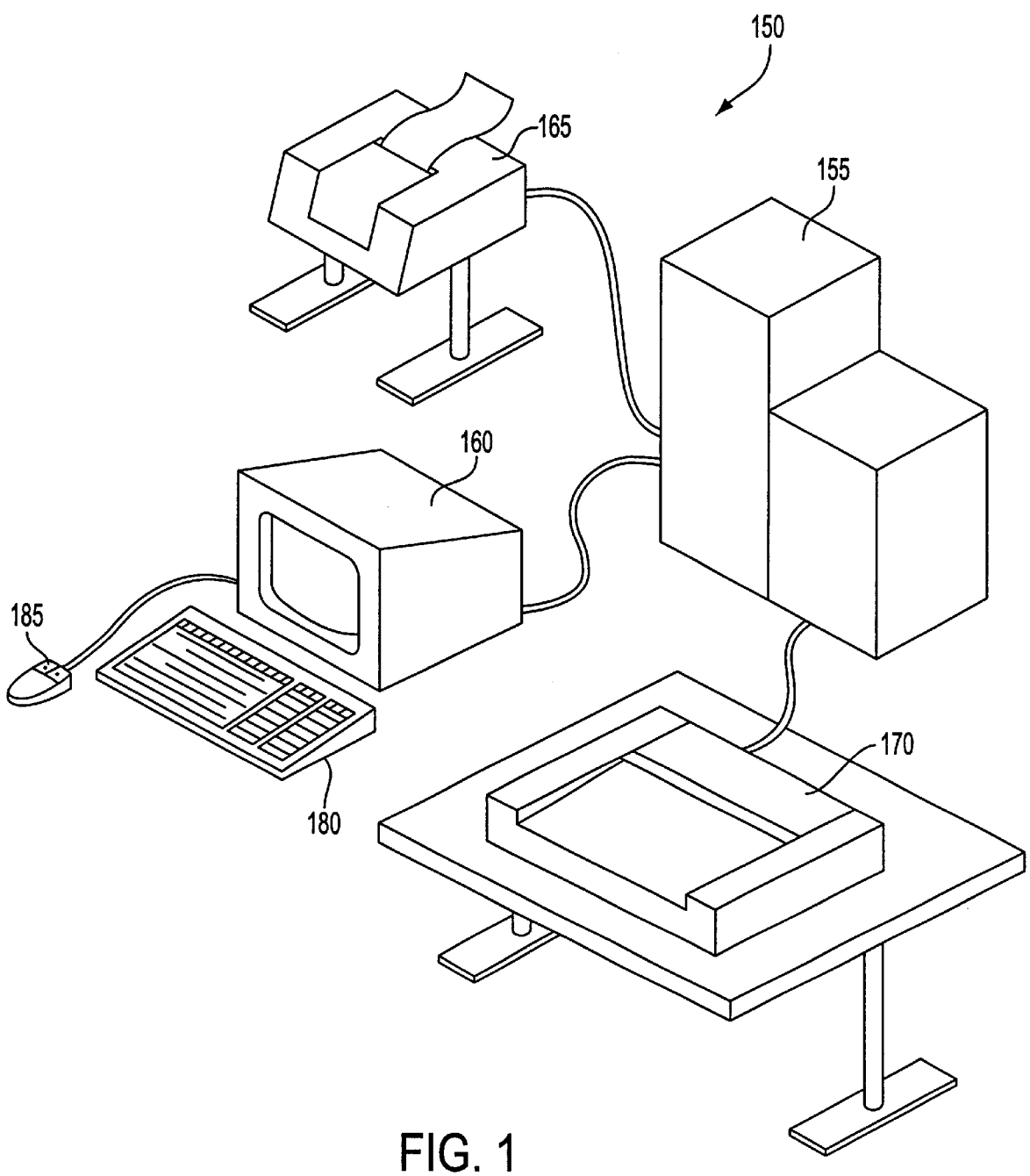
FIG. 1 is a schematic diagram of a host computer system which is capable of implementing the present invention.

Referring in detail now to the drawings wherein similar parts or steps of the present invention are identified by like reference numerals, there is seen in FIG. 1 a schematic diagram of a host computer system 150 which is capable of implementing the present invention. The host computer system 150 preferably includes a computer 155, a display 160, a printer 165 and a plotter 170. The computer 155 is typically a personal computer or workstation. The display 160 displays both graphical and textual materials relating to the design of integrated circuits. Also included in the computer system 150 is a keyboard 180 and a pointing device 185 such as a "mouse". When operating with software tools used in integrated circuit design, the computer system 150 essentially becomes a series of electronic circuits for accomplishing specific design functions. One example of such software tools is Aquarius, which is commercially available from Avant! Corporation of Fremont, Calif.

Figure 2:
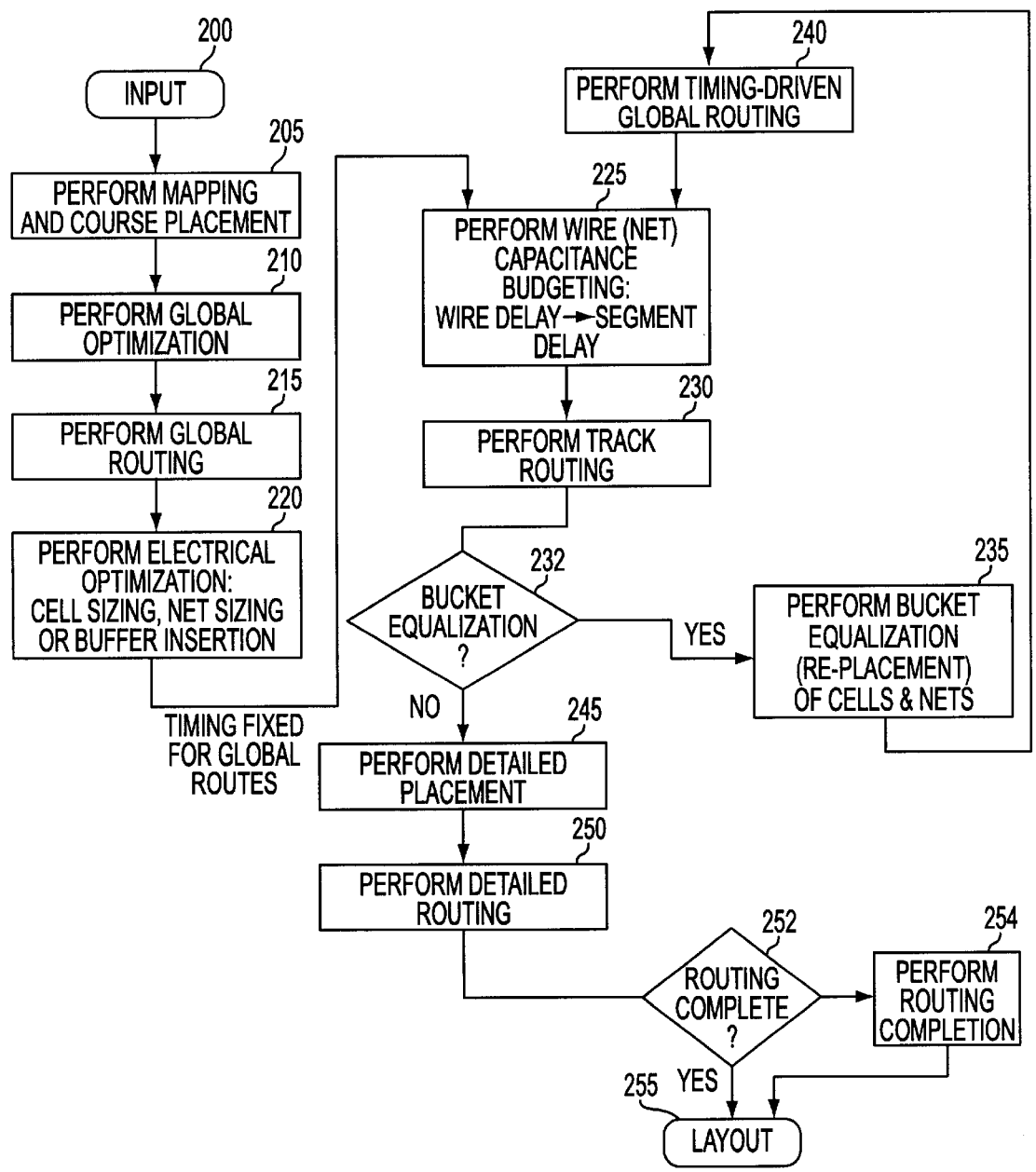
FIG. 2 is a flowchart describing a method of the present invention.

FIG. 2 is a flowchart describing an overview of the automated method of the present invention that is implemented using a computer program containing sequences of instructions that implement each of the various steps described hereinafter. The automated program thus implements a method that includes the following steps below. It is noted further that in the flowchart of FIG. 2, each of the steps has its own distinct computer instructions (i.e., each of the steps 200–254 comprises further steps). Initially in step 200, a netlist or other electronic circuit description is received as an input in the placement and routing process in accordance with the invention. This netlist includes information on all the interconnections between the terminals of the cells in a specified circuit to be implemented. Based on the provided netlist, in step 205 the specified circuit is mapped to a library of cells (not shown). Coarse placement is also performed in step 205 whereby each cell (which has a specified function) is assigned to or associated with a specific bucket (e.g., bucket 310 in FIGS. 3A–3C) which represents bucket on a semiconductor die.

In step 210, a global optimization is performed whereby the specified circuit is partially remapped. This optimization is based on the initial positioning of cells (as performed in the coarse placement step 205) and may change the logic structure of the specified circuit. In step 215, global routing is performed whereby the net topologies (i.e., net lengths) and net interconnection layer (i.e., conducting medium) assignments for cells that are located in different buckets are determined. The net topology information which results from the global routing step 215 is used as a basis when performing optimizations in the electrical optimization step 220. Predetermined timing constraints (which have been predetermined prior to coarse placement 205) are satisfied in the electrical optimization step 220.

In step 225, net capacitance budgeting is performed whereby the capacitance of each net may be adjusted in order to meet the capacitance constraints of the nets. In the track routing step 230, the routing order is determined for the global routes (wherein the topologies of the global routes have been determined in the above global routing step 215). Additionally, in the track routing step 230, modified positions are determined for the global routes which will be placed on the semiconductor die. The modified positions of the global routes take into account the cross-talk capacitance of each net such that timing constraints for the designed circuit are met.

In step 232, it is determined if bucket equalization is to be performed, and this step involves examining the differences in bucket sizes. As best shown in FIGS. 12A–12C, bucket equalization is performed to reduce the size of the largest bucket in a given row (e.g., row 710) or a given column so that the chip size is optimized. If bucket equalization is performed, as shown by step 235, then certain cells may be moved to neighboring buckets (see FIGS. 12A to 12C). Since the bucket equalization step 235 changes the positions of some of the cells, it is necessary to again perform a global routing step. This is shown in FIG. 2 as a timing-driven global routing step 240. Additionally, the capacitance budgeting step 225 and track routing step 230 are again performed.

In step 245, detailed placement is performed whereby the final position is determined for each of the cells within each bucket to be placed on the semiconductor die. It is noted that cells that are connected to other cells entirely within a bucket have not yet been operated upon to ensure that timing constraints are met for such cells. In step 250, detailed routing is performed, while in step 252 it is determined if routing completion is achieved. If not, then the routing completion step 254 is performed. To insure routing completion, the chip layout may be torn at "tear lines" (see FIGS. 16A–16C) to create additional space for routing. The layout is then generated in step 255.

As described above and shown in FIG. 2, the placement of cells is divided into two separate stages: coarse placement step 205 and detailed placement step 245. Additionally, the determination of global routes is divided into two stages: the global routing step 215 and track routing step 230. Additionally, according to the present invention, the global routing step 215 is performed before cell placement positions have been fixed or finalized. The advantages of separating cell placement into two stages and global routing into two stages are elaborated upon more fully hereinafter. In contrast, in conventional place and route methodologies, cell placement is performed in one step and global routing is performed in another step. For example, in conventional methodologies, cell placement is performed, followed by an optimization step and global routing.

Coarse Placement

The coarse place step 205 is performed based on the netlist or electronic circuit description input of step 200. As known to those skilled in the art, the netlist is a set of information, typically a "recipe" in the form of a data structure stored in a computer. The netlist denotes all the interconnections between the terminals of the circuit components in a specified circuit. Other information which serves as input in step 200 may include the position in which each cell should be disposed on the semiconductor die, the shape of each cell, positions where nets are forbidden to pass through in the semiconductor die, and/or process design rules which specify specific technology information such as minimum widths and spacing.

In the coarse placement step 205, an approximate (initial) placement of cells 315 (FIG. 3B) is determined so as to obtain an initial or preliminary measurement of the nets for the desired circuit, while at the same time leaving sufficient flexibility in the netlist to permit electrical optimizations (e.g., step 220 in FIG. 2) and other synthesis steps. Preferably, the coarse placer determines the intended placement of cells 315 (FIG. 3B) such that the total net length is minimized while the wiring density is spread evenly over the semiconductor die. The coarse placer need not be timing-driven, since timing violations which occur can be compensated in the electrical optimization step 220. The initial placement of cells 315 (as determined by the coarse placer) and the global routing topologies (as determined from the global routing step 215) serve as inputs for the electrical optimization step 220.

Figure 3A:
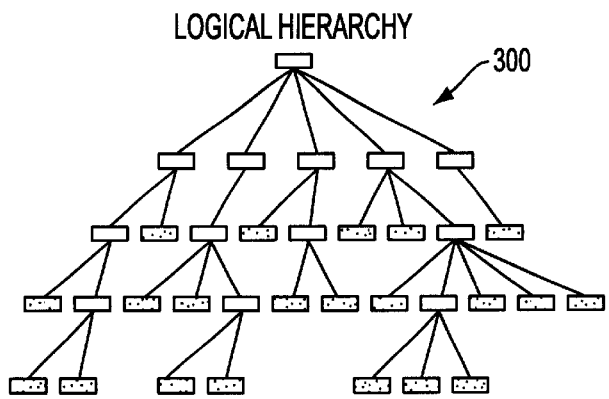
FIG. 3A is a schematic block diagram of a logical hierarchy of a circuit in accordance with the invention.
Figure 3B:
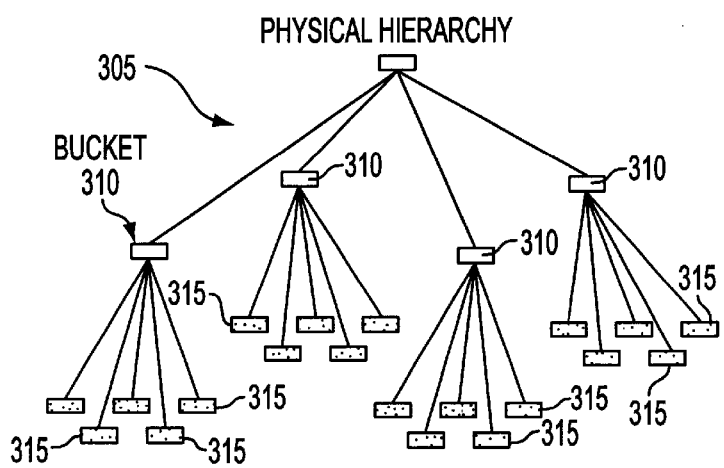
FIG. 3B is a schematic block diagram of a physical hierarchy of a circuit in accordance with the invention wherein the physical hierarchy includes "buckets" with assigned cells.
Figure 3C:
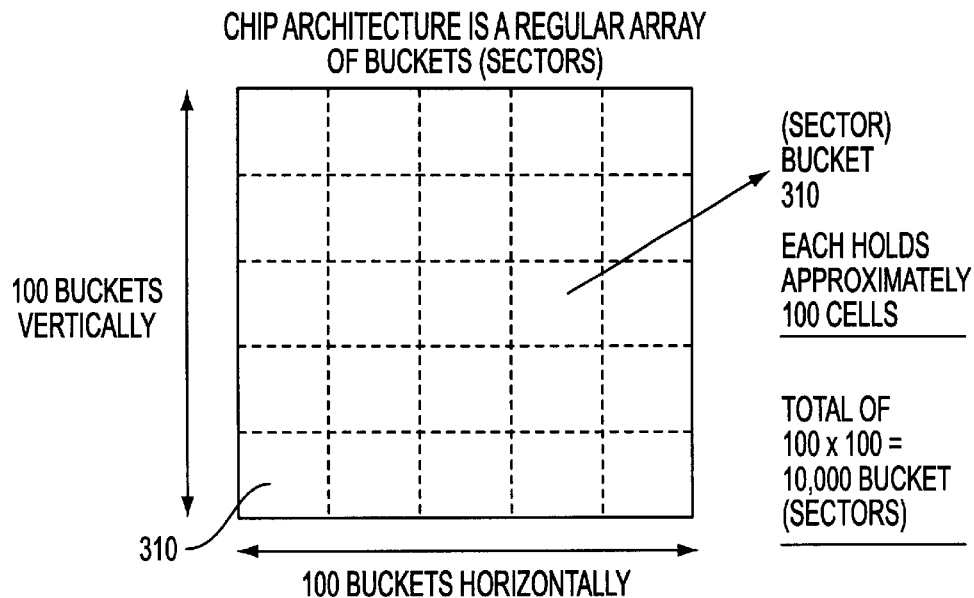
FIG. 3C is a partial top elevational view of a plurality of "buckets" wherein cells are placed or assigned inside the buckets.

FIGS. 3A to 3C show conceptually how a circuit design is transformed from a logical hierarchy 300 to a physical hierarchy 305 during the coarse placement step 205. In the physical hierarchy 305, the intermediate logic levels in the logical hierarchy 300 are associated with or grouped in buckets (sectors) 310 wherein each bucket 310 holds, for example, about one-hundred (100) cells 315. The cells 315 will form the designed circuit. The buckets 310 represent sectors in the placement area of the semiconductor die. The number of cells 315 which can be placed (associated) within a given bucket 310 can range, preferably, from about 20 cells to about 200 cells. Each cell 315 is assigned to a particular position in a given bucket 310. Furthermore, the cell sizes have not yet been finalized at this stage of the design process, since cell sizes may be adjusted in the electrical optimization step 220 (FIG. 2).

To perform the coarse placement step 205, a conventional placer may be used. General placement techniques known to those skilled in the art are used for placing the cells 315 in given buckets 310. Such general placement techniques include min-cut, simulated annealing, and quadratic placement.

The buckets 310 are arranged, for example, in an array as shown in FIG. 3C. If the designer chooses to keep a given group of cells 315 together, then the given group of cells 315 are grouped in the same bucket 310 or in neighboring buckets. Preferably, each bucket 310 is sized small enough such that cell placement anywhere within it has an insignificant effect on timing. However, the size of a given bucket 310 should also be large enough to accommodate the re-mapping and re-sizing of cells 315 contained in the given bucket. A given bucket must also be large enough to enable a meaningful detailed placement of the cells 315 inside a given bucket 310. The dimensions of a given bucket 310 and a given bucket array is programmed in the placer which performs the coarse placement step 205.

Pre-routes and pre-places are also read into the bucket structure in order to drive the placer and global router. According to the invention, pre-placement of standard cells and pre-routing of specific nets are permitted. The cells can be shifted apart slightly in positions and some nets can be stretched slightly. These pre-placements and pre-routing are formed in the bucket 310 structure and thus reduce the capacity of certain buckets. The pre-routed nets can include the power nets and the clock nets.

The coarse placement step 205 provides an advantage of permitting the placer to place cells at a faster rate, as compared to conventional approaches, as best illustrated by the following comparison. In a one-hundred-by-one-hundred (100×100) bucket array, the placer can place a cell after consideration of 10,000 (i.e., 100×100) different possibilities. In contrast, in a conventional design approach, a placer can place a cell after consideration of, for example, one-million different positions if the designed circuit will utilize one-million cells.

Figure 4:
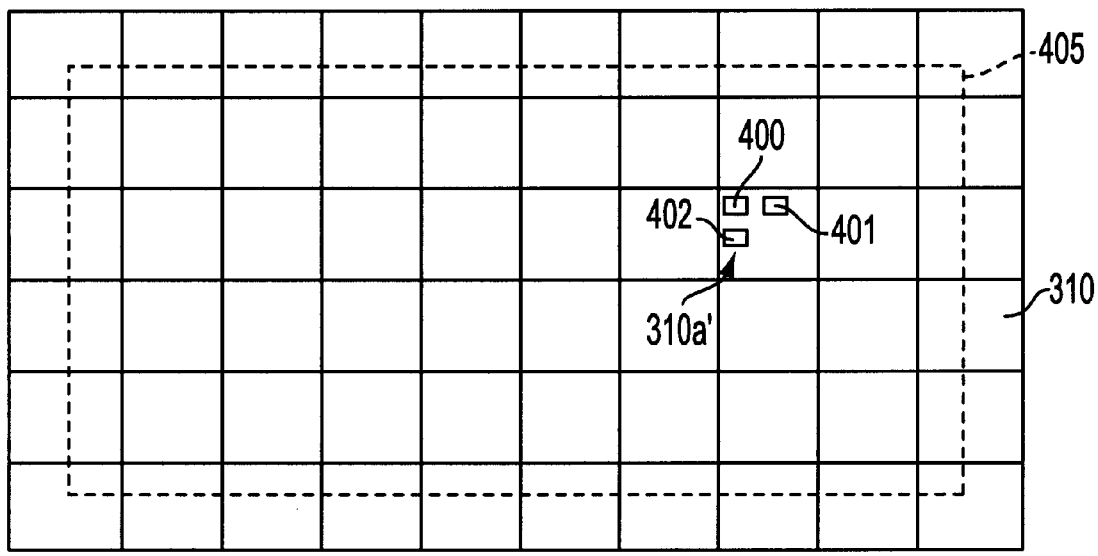
FIG. 4 is a schematic diagram showing a plurality of hierarchical modules (in a circuit) as being grouped together in a given bucket.
Figure 5A:
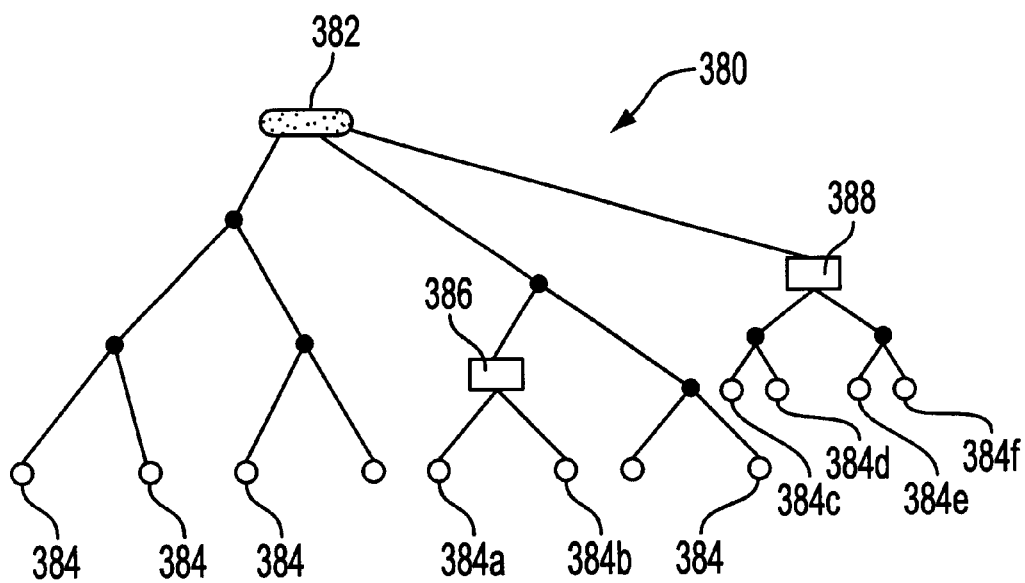
FIG. 5A is a hierarchical netlist comprising a top hierarchical level, intermediate levels, and a low hierarchical level (which comprises cells)
Figure 5B:
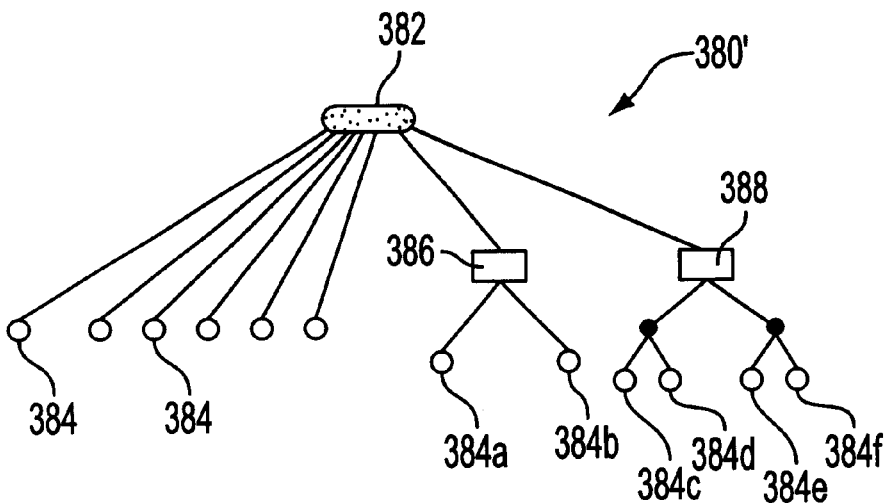
FIG. 5B shows a resulting netlist if the hierarchical netlist of FIG. 5A is flattened.
Figure 5C:
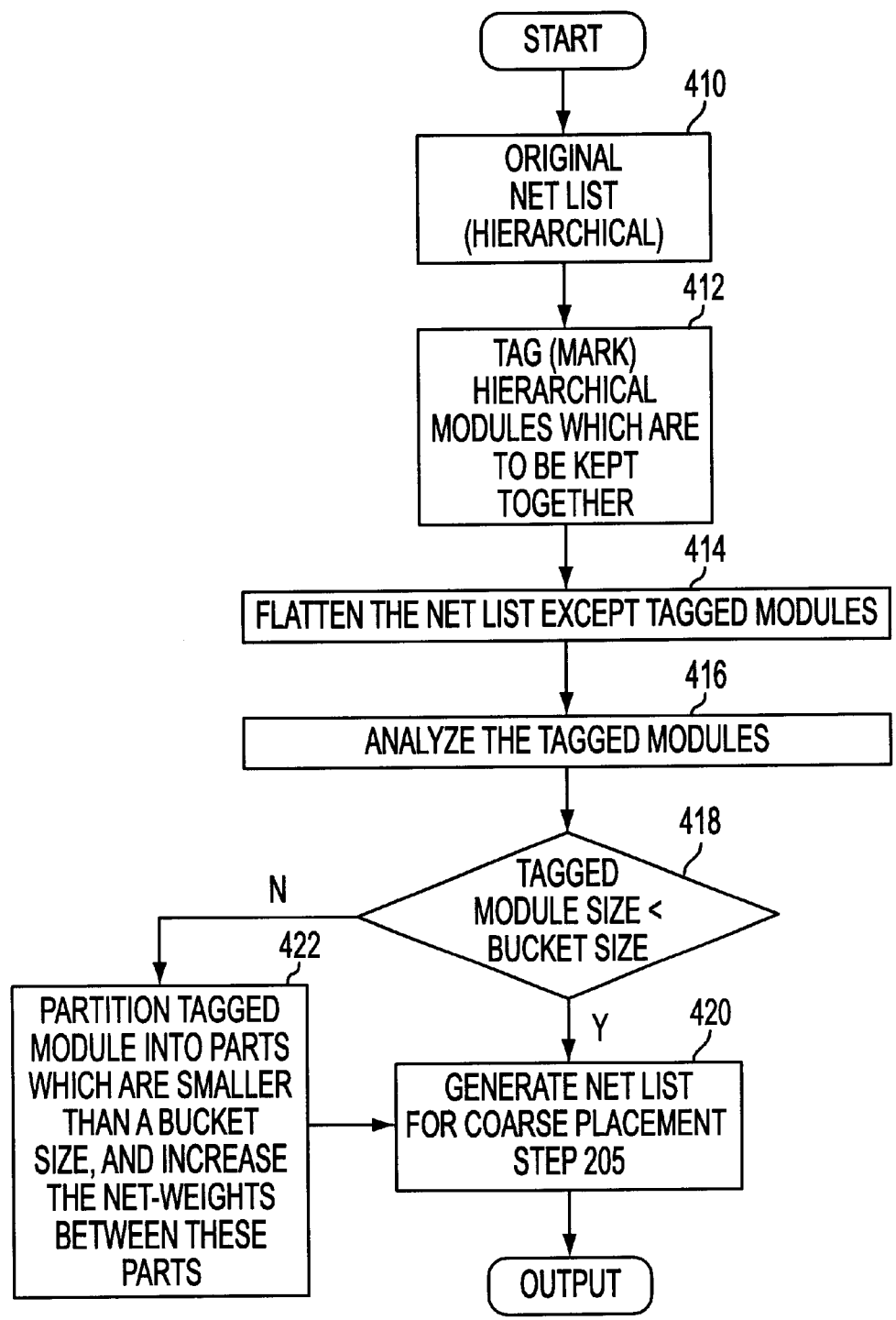
FIG. 5C is a flowchart describing a method for generating a netlist for use in a coarse placement step while grouping together pre-determined hierarchical modules.

Referring now to FIG. 4, certain hierarchical modules (models) 400, 401 and 402 may be grouped together by forcing them to be placed in the same bucket 310a'. FIGS. 5A–5C show a method for performing clustering in accordance with the present invention which can assist in keeping cells that are desirably kept together in the same bucket. This clustering step can be performed prior to the coarse placement step 205 (FIG. 2). Referring first to FIG. 5A, there is seen a hierarchical netlist 380 comprising a top hierarchical level 382 which represents the entire integrated circuit, and a low hierarchical level which comprises cells 384 which form the integrated circuit. The hierarchical netlist 380 further comprises intermediate hierarchical levels such as the modules 386 and 388 which contain cells that are desirably kept together physically. In FIG. 5A, the cells 384a and 384b are grouped (associated) in module 386, while the cells 384c–384f are grouped (associated) in module 388. If the hierarchical netlist 380 is flattened, then it is transformed, for example, into the netlist 380' as shown by FIG. 5B.

Referring now to FIG. 5C, there is seen a method for generating a net list for use in a coarse placement while keeping together desired hierarchical modules. In step 410 the original hierarchical netlist 380 is provided. In step 412, the circuit designer can conventionally tag (i.e., mark) given modules (e.g., modules 386 and 388) in the intermediate hierarchical levels, if the circuit designer intends to keep together components which form the given modules. In step 414, the hierarchy of the netlist 380 is flattened except for the tagged modules of step 412. The flattened netlist 380' is shown in FIG. 5B. In step 416, the tagged modules 386 and 388 are analyzed. If in step 418 each of the tagged modules 386 and 388 fits within a bucket size, then a net list is generated in step 420 for coarse placement. If in step 418 a tagged module does not fit within a bucket size, then the tagged module is partitioned into parts which are smaller than a bucket size (step 422). The net weights are increased between the partitioned parts so that the parts are placed closed to each other in the layout.

A "bottom-up clustering step" can be performed before the coarse placement step 205 (FIG. 2) so as to speed up the placement. This bottom-up clustering step will "greedily" force logic together whereby predetermined portions (or highly connected portions) of the desired circuit 405 (FIG. 4) are associated together with a higher priority as compared to other portions of the desired circuit. Typically, logic which is forced together ranges from about 10 to about 25 cells and occupies about ¼ of the space in a given bucket.

For the case when the size of a hierarchical module (in a desired circuit shown by dashed box 405 in FIG. 4) is larger in size than a given bucket 310, the hierarchical module can have different parts thereof associated with a plurality of given buckets 310. The plurality of given buckets 310 containing the hierarchical module can then be kept together by specifying a stronger connection constraint between the given plurality of buckets 310. A stronger connection constraint between a given plurality of buckets 310 (or between certain cells in different buckets) is accomplished as follows. Coarse placers have an objective of assigning initial cell positions so that the net lengths are minimized in the desired circuit. By specifying to the coarse placer that a given net coupled between first and second cells should be shorter than another net coupled between first and third cells, the coarse placer will group the first and second cells closer together than the first and third cells, regardless of whether the first and second cells are in the same bucket. The specified length of a given net is preferably given relatively, by using a parameter that indicates, relative to the other nets how long it should be, i.e., a connection constraint. Thus, if the weight of the given net is increased, then the specified permissible length of the given net is increased.

Global Optimization

The global optimization step 210 involves a timing-driven, partial re-mapping of the desired circuit and is based on the cell placement information obtained as a result of the coarse placement step 205. (The timing requirements or constraints have been determined before the coarse placement step 205 of FIG. 2). In the global optimization step. 210, a rough estimate of the net lengths are made (based on cell placement information), and this net length estimate serves as an input for performing structural improvements which can be made to the netlist. These structural improvements involve timing-driven re-mapping of the desired circuit and other optimizations which can change the logic structure of the circuit. Other optimizations include logic level reduction, logic duplication, and automatic test pattern generation (ATPG) based're-wiring.

In the global optimization step 210, only a few of the cells are preferably re-assigned to other positions, and thus most of the cell assignments which have been performed during coarse placement are intact. After the global optimization step 210 is performed, the few re-assigned cells are placed in feasible buckets, while maintaining the sizes of the buckets relatively equal to each other. Preferably, according to the present invention, the global optimizations step 210 is performed before the global routing step 215, since a rough interconnect model (resulting from the coarse placement step 205) is typically sufficient when performing the global optimization step 210. In addition, since the global routing step 215 has not yet been performed at this stage of the design process, there is no need to update any global routes after performing the global optimization step 210.

At this stage of the design process, the following special nets may also be pre-routed, such as power and ground nets and clock nets. Commercially available routers typically have power net routing capabilities. The power net pre-routing is performed in full detail, and immediately written in the chip image database. The structure of the power nets may, for example, be a regular mesh of nets which are over-dimensioned to account for the fact that the actual power consumption will not be known until at a very late stage in the physical design process. Power estimation and simulation may be performed by an external tool such as PowerMill™ from the Epic Technology Group of Synopsys, Inc. The routing of clock nets is customer-specific. The clock nets are typically pre-routed in a fixed pattern, such as H-trees.

Global Routing

The global routing step 215 (FIG. 2) is used to determine the net topologies (i.e., net lengths) and the interconnection layer assignments for the nets. The net topologies information provides additional net delay information for use in the optimization step 220 (FIG. 2). Specifically, the net topologies information serves as an input in the delay analysis and repeater insertion steps, both of which may be performed in the electrical optimization step 220 (FIG. 2). The net topologies information provide a fairly accurate model for estimating the delays in the desired circuit, since the capacitance of each net can be estimated based on net length. Gate size adjustments can be performed in optimization step 220 to meet timing constraints. Repeaters are inserted in long nets to optimize the circuit area and still permit the timing requirements to be met, as discussed in co-pending and commonly assigned U.S. Patent Application entitled "Timing Closure Methodology". As also discussed in further detail below, the net topologies information are further used to guide the detailed routing step 250 (FIG. 2).

Additionally, the global routing step 215 includes the optimization goals of minimizing the total net length of the desired circuit and of spreading the net routing evenly across available routing areas on the chip so as to avoid congestion problems.

At this point in the design flow (global routing step 215), the global router is preferably not "timing driven" in the sense that that timing violations in the desired circuit will be tolerated at this stage of the design process and subsequently compensated for in the optimization step 220. In contrast, current methodologies perform timing-driven placement and timing-driven global routing in early stages of the design flow after the netlist input. By placing timing constraints on a significant amount (e.g., 30%) of global routes at this stage of the design process, less than optimum routing may result, since the imposed timing constraint may prohibit the routing of these nets as longer-length nets which would thus prevent routing congestion problems. Consequently, in conventional methodologies nets that have been determined and set cause over-concentration of cells in a particular area.

It is further noted that in the present invention, five (5) layers of interconnections (conducting medium) may be used. A minimum number of three (3) interconnection layers should at least be available, while the maximum number of interconnection layers may vary.

In the global routing step 215, a conventional global router may be used. The router determines the net topologies based on the cell placement information obtained from coarse placement step 205. Unlike conventional approaches, according to the present invention, the global router need not have the "exact" positions of cells to perform the global routing. Global routing is performed based on cell placement information obtained from the coarse placement step 205.

FIG. 6A is a partial top view of a first interconnection layer 450 to be formed in the semiconductor die, while FIG. 6B is partial top view of a second interconnection layer 455 to be formed in the same die. The global routes formed during the global routing step 215 include a set of connected net segments, generally illustrated as 460. According to one preferred embodiment of the present invention, each net segment 460 starts at a middle region of a bucket 310 and ends at the middle region of another bucket 310. For example, assuming the interconnection layer 450 in FIG. 6A is a metal-1 layer, the net segment 460a begins at the middle region of the bucket 310a and ends at the middle region of the bucket 310b. Assuming the interconnection layer 455 in FIG. 6B is a metal-2 layer, a net segment 460b begins at the middle region of the bucket 310c and ends at the middle region of the bucket 310d. As further shown in FIGS. 6A and 6B, each net segment 460 is straight and is further assigned to a particular interconnection layer (e.g., interconnection layers 450 or 460).

As discussed above, when the global routing step 215 is performed, the actual positions of the cells to be placed (and cell terminals) are not exactly known. Thus, each net segment that spans across bucket boundaries is approximated by being configured to start at a middle region of a bucket and end at a middle region of another bucket, for estimation purposes.

The global router can be programmed to read and take into account the pre-routed nets by decreasing the available routing resources along the paths of the pre-routed nets.

Electrical Circuit Optimizations

At this point in the design process, shown in FIG. 2 as step 220, the approximate topologies of all nets that cross bucket boundaries are known based on the global routes. These net topologies provide a fairly accurate model for estimating the delays of these nets. The estimated delay of a given net is determined based on the net capacitive load approximations as determined by net length. These estimated delays can then be compared with the timing requirements (which were determined prior to the coarse placement step 205), so as to determine if the timing requirements will be met.

To meet the predetermined timing requirements (constraints), adjustment of the cell sizes and net wire widths can be made. Cell size adjustment is the process of selecting the appropriate drive strength for each cell such that the timing requirements are met. The drive strengths are selected directly from the library or by duplication of library cells. A wider range of cell sizes can also be created if the outputs of cells are tied together. For example, from a cell library with cells having the drive strengths "1", "2", and "4", a cell with a drive strength of "3" can be created by connecting in parallel a cell with drive strength 1 with a cell with drive strength 2.

Net wire width adjustments can also be used in conjunction with cell sizing to satisfy predetermined timing requirements for critical nets in the desired circuit wherein the critical nets are defined as nets close to their capacitance budgets. In other words, the timing parameter of a given global route may be set based on net wire width adjustments. As discussed below, the timing constraint for a given net is met if the net is within its capacitance budget. Net wire width can be adjusted to a discrete width having a value as shown by equation (1):

$$\text{Net Width} = (\text{minimum net width}) \times N \qquad (1)$$

wherein the minimum net width is typically 0.4 micro-meter and N=1.0, 1.5, 2.0, 2.5, etc. The range for the parameter N depends on the adjusting capability of the router.

Figure 7:
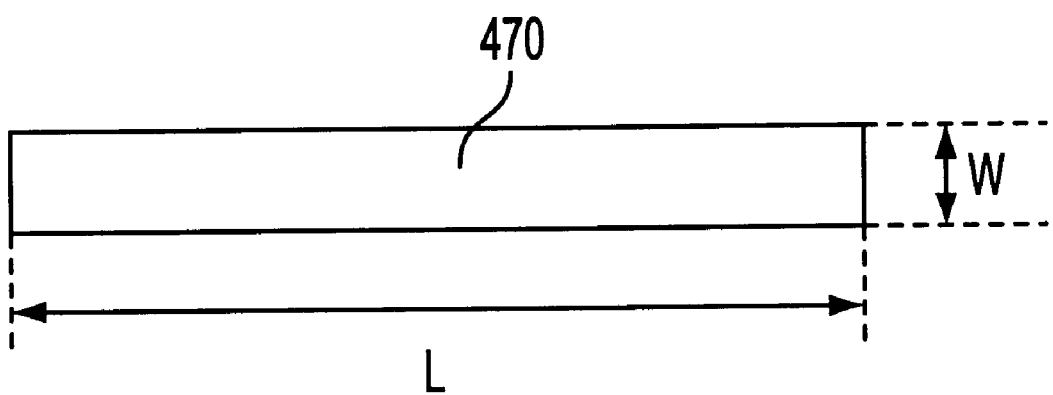
FIG. 7 is a partial top elevational view of a global route having a length L and a width W.

Net wire width adjustments serve to assist in satisfying electro-migration constraints in design rules and timing constraints. An electro-migration constraint is the maximum current value which is permitted to flow through a wire of a certain width so that the wire does not result in an early burn out. The delay of a given net is represented by $\pi = RC$ wherein R is the net resistance and C is the net capacitance. Thus, the delay of a given net can be adjusted by changing the net resistance R and/or net capacitance C values. Referring now to FIG. 7, there is seen a net 470 having the length L and the width W. By increasing the net length L (and holding constant the net width W and net capacitance C), the resistance R of the net 470 increases. By increasing the net width W (and holding constant the net length L and net capacitance C), the resistance R of the net 470 decreases.

As an option in the electrical optimization step 220, buffers can also be inserted at proper points in the topologies of long nets to save area. If a buffer is to be inserted, then the netlist and the global route will change. Co-pending and commonly-owned U.S. Patent Application entitled, "Timing Closure Methodology," describes a methodology for performing buffer insertions in order to save area.

At this stage of the design process, it is known whether the timing requirements can be met. If the timing requirements can be met, then the timing budget on each of the nets is fixed. The subsequent steps 225 to 254 are performed so that the timing requirements are satisfied. To insure satisfaction of the timing requirements, the circuit area may be enlarged.

Net Capacitance Budgeting

Net capacitance budgeting step 225 follows the optimization step 220, and the timing requirements for the topologies of the nets related to global routes are fixed and will have to be met. As known to those skilled in the art, the delay provided by a given net is determined by the resistance of the net and the capacitance between the given net and a neighboring net. It is difficult to adjust the resistance of a given net, and as discussed above, net resistance adjustment involves adjustment of the net wire width. Thus, to adjust the delay provided by a given net so as to meet timing constraints, the capacitance between the given net and a neighboring net can be adjusted by controlling the distance between both nets. Therefore, the adjustments of capacitance between nets provide another method for setting the timing parameters of global routes.

Figure 8A:
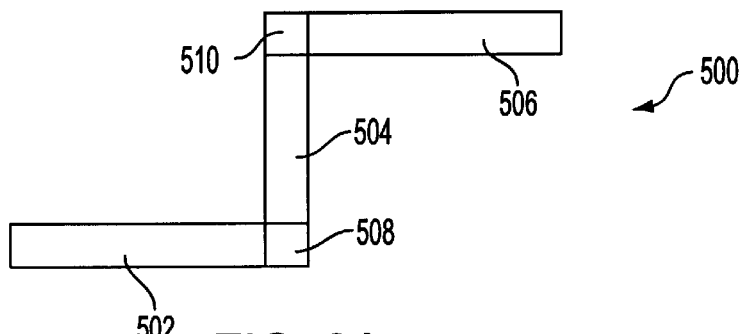
FIG. 8A is a partial top elevational view of a net which results from the global routing step and which comprises three segments.

In the capacitance budgeting step 225 (FIG. 2), the maximum amount of capacitance is determined for each of the nets associated with global routes such that timing constraints for those nets are met. Referring now to FIG. 8A, there is seen a net 500 comprising the segments 502, 504, and 506 which resulted from the global routing step 215. A via 508 is disposed between the intersection of the segments 502 and 504, while a via 510 is disposed between the intersection of the segments 504 and 506. The Elmore delay model is preferably used to determine a maximum capacitance value for each net segment in the designed circuit, such that the designed circuit will likely meet the timing constraints. This maximum capacitance is also known as the "capacitance budget" which denotes the total capacitance (including net-to-ground capacitance and net-to-net capacitance).

Figure 8B:
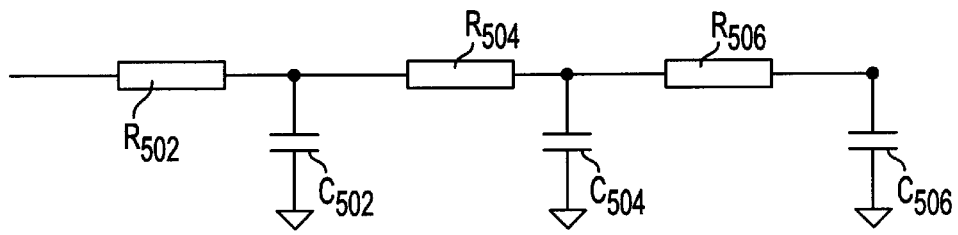
FIG. 8B is a schematic diagram comprising discrete resistive and capacitive elements which represent an Elmore delay model of the net of FIG. 8A.

Different variations based on the Elmore delay model may be used to determine the capacitance budget of a given net segment. For example and as best illustrated in FIG. 8B, the segments 502, 504, and 506 can be modeled as discrete resistive and capacitive elements. The resistor $R_{502}$ represent the resistance of the segment 502, while the capacitor $C_{502}$ represent the capacitance of the segment 502. Similarly, the segment 504 is modeled into the resistor $R_{504}$ and capacitor $C_{504}$, while the segment 506 is modeled into the resistor $R_{506}$ and capacitor $C_{506}$. The values of the capacitors $C_{502}$, $C_{504}$ and $C_{506}$ can be set such that the delay constraint for the net 500 is met.

Figure 8C:
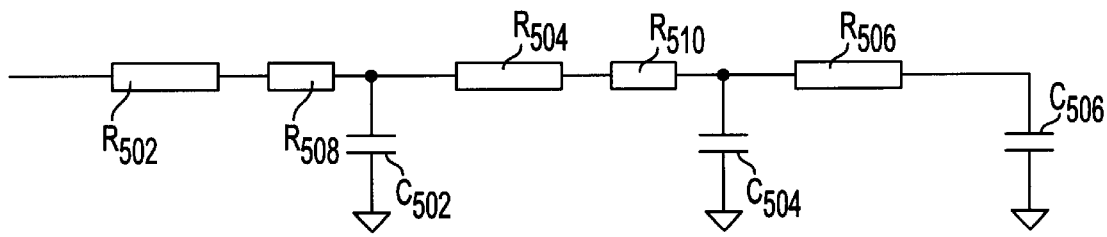
FIG. 8C is a schematic diagram which represent a variation of the Elmore delay model of FIG. 8B.

The Elmore delay based model of FIG. 8B can be varied by taking into account the resistance provided by the vias in the net segment intersections. For example and as best illustrated in FIG. 8C, the resistors $R_{508}$ and $R_{510}$ have been added to represent the resistance provided by the vias 508 and 510, respectively. Other variations can be made on the Elmore delay based models shown in FIGS. 8A and 8B. Additionally, in measuring the actual delay provided by the resistance and capacitance of a given net or net segment, a conventional timing tool is used.

Figure 8D:
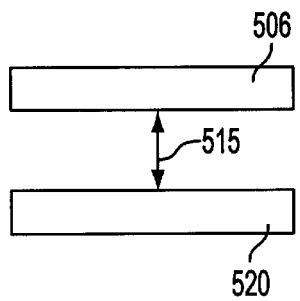
FIG. 8D is a partial top elevational view of two adjacent net segments separated by a given distance which determine net-to-net capacitance.

FIG. 8D shows an example wherein two given adjacent net segments 506 and 520 are separated by the distance 515.

The capacitance between the two given adjacent net segments 506 and 520 decreases as the distance 515 between the net segments increases. Conversely, the capacitance between the two given adjacent net segments 506 and 520 increases as the distance 515 between the net segments decreases. This distance 515 is controlled in the track routing step 230 (FIG. 2), during which the positions of the global routes are fixed. Thus, the present invention permits capacitance control on a net-per-net basis.

In contrast, conventional methodologies typically attempt to decrease net delay by routing the nets based on a "worst case capacitance" analysis. This approach leads to larger die sizes than necessary and greater power consumption requirements.

Track Routing

In the track routing step 230 (FIG. 2), which follows the capacitance budgeting step 225, the routing order for the global routes are determined. The track routing step 230 further determines the actual positions in which the global routes will be fixed. The actual positions of the global routes are fixed such that the capacitance between nets are set at values which permit the timing requirements of the designed circuit to be met.

Net neighbor relations can be determined at this stage of the design process, while a fairly global view of the circuit is still possible. Net neighbor relations are important since they may also determine cross-talk sensitivity. At the simplest level, cross-talk constraints can be translated into net neighbor constraints.

Preferably, the track router operates substantially in the upper layers (which are the metal-3, metal-4 and above layers), thereby leaving the metal-1 and metal-2 layers for the detailed router to make local connections.

FIG. 9A is a partial top view of an interconnection layer 550 in a semiconductor die, as shown during a horizontal track routing step, while FIG. 10B is partial top view of the same interconnection layer 550 during a vertical track routing step. The track router fixes the final position of each net segment 460 (wherein a net segment 460 spans across at least a bucket boundary and may span several routing buckets 310).

In contrast, conventional design approaches do not use a track routing step before performing the step of fixing the positions of each of the cells in the circuit. Conventionally, cell placement is performed, and global routing and detailed routing steps follow. In addition, in conventional approaches, a pin assignment step is typically required whereby internal pins are placed in the boundaries (interface) of local routing regions so that the router is able to perform local routing. In contrast, the present invention does not require the conventional pin assignment step since the track routing step 230 implicitly accomplishes pin assignments between buckets. When the track router places entire net (wire) segments across several buckets, pin positions are also fixed automatically on the bucket boundaries which are crossed by the net segments.

In accordance with the present invention, the track router operates based on defined channels (such as channel 560 in FIG. 9A and channel 565 in FIG. 9B) across the chip as the wire segments 560 are fixed. A channel is a defined region spanning the width of the integrated circuit design. A channel may span over as much as about one-hundred (100) buckets. The height of a channel is equal to about one (1) bucket.

During the horizontal track routing step (as best shown in FIG. 9A), the track router fixes the position of each of the generally horizontal net segments 460H along given horizontal channels (e.g., horizontal channel 560). During the vertical track routing step (as best shown in FIG. 9B), the track router fixes the position of each of the generally vertical net segments 460V along given vertical channels (e.g., vertical channel 565). The positions of the generally horizontal net segments 460H and generally vertical net segments 460V are set so that the capacitance budgets (as determined in step 225 in FIG. 2) are met.

The track router works its way from one channel to another channel, and works on channels in all of the interconnection layers. The track router places net segments 460 based on the global router's determination of which of the net segments 460 should pass through a given channel, wherein the width and the maximum capacitance of each net segment 460 have also been determined previously.

The ordering and spacing of the net segments 460 will have the most significant influence on the capacitive load on the nets. The reason is that the capacitance between two nets (or net segments 460) increases as the distance between the nets decreases. For example, FIG. 10 shows a channel 600 wherein the spacing between the net segments 460c and 460d have been set to meet the capacitance budgets.

The track router will preferably place the net segments 460 in a channel (e.g., channel 600), while optimizing the ordering of the placing such that the capacitance budget of each net segment is met. To allow maximum freedom for the ordering of the placement of net segments 460, vertical constraints should be eliminated, wherein elimination of vertical constraints means that a net ending in a bucket 310 occupies an entire row of the bucket 310. As known to those skilled in the art, by eliminating vertical constraints the routing of a given channel will not depend on the routing which has been performed on an adjacent channel. The elimination of vertical constraints thus removes any requirement that the channels (e.g., channel 600) be routed in a particular order, for each interconnection layer. The elimination of vertical constraints allows the designer more flexibility in dealing with cross-talk issues in the design.

Figure 10:
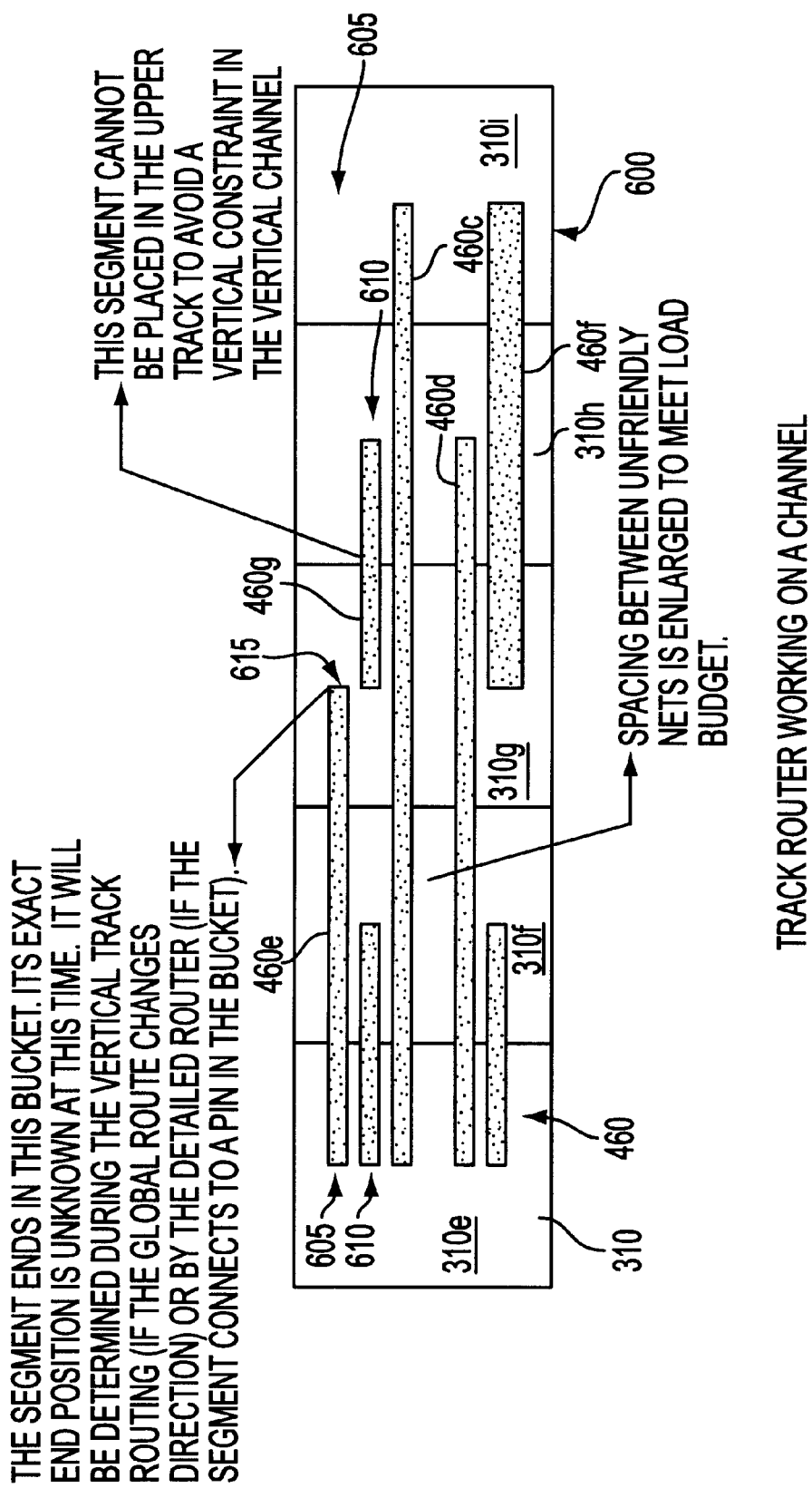
FIG. 10 is a top elevational view of track routing on a channel whereby vertical constraints have been eliminated so that empty spaces are present in some of the buckets.

FIG. 10 shows an example wherein vertical constraints have been eliminated. The net segment 460e will occupy its given row 605 in the buckets 310e, 310f, and 310g. The net segment 460g will occupy its given row 610 in the buckets 310g and 310h. By eliminating the vertical constraints, empty spaces will be present in some of the buckets 610. For example, the net segment 460e does not completely extend across the bucket 310g. Since the vertical constraints are eliminated in the channel 600, it is not permissible to move the net segment 460f into the row 605 (of buckets 310g, 310h, 310i).

The end position 615 of the net segment 460e is not exactly known at this stage of the design process, and therefore, as described previously, is approximated as ending in the middle of the bucket for the track routing step. The end position 615 of the net segment 460e may be finalized during the vertical track routing if the global route "changes directions". For example, in FIG. 9B the end position of a horizontal net segment 460' is determined when it changes directions upon formation of the vertical net segment 460" during vertical track routing. The end position 615 of the net segment 460e may also be finalized by the detailed router during the detailed routing step 245 (FIG. 2) if the net segment 460e is connected to a "cell terminal" in the bucket 310g.

Figure 11B:
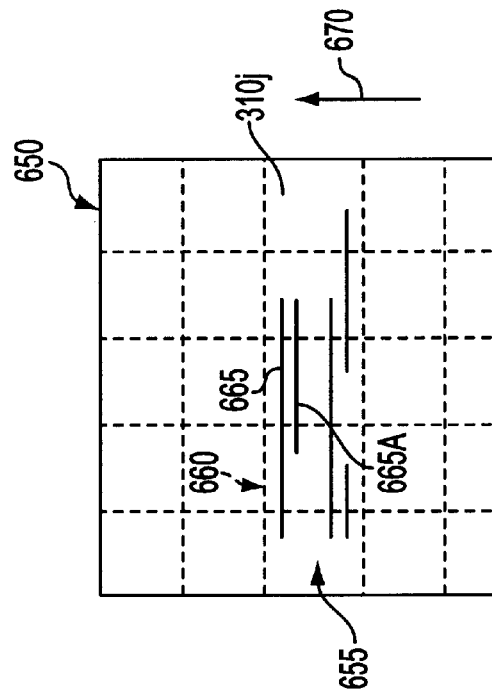
FIG. 11B is a partial top elevational view of an interconnection layer image wherein the channel is enlarged to create additional space to fit net segments.
Figure 11A:
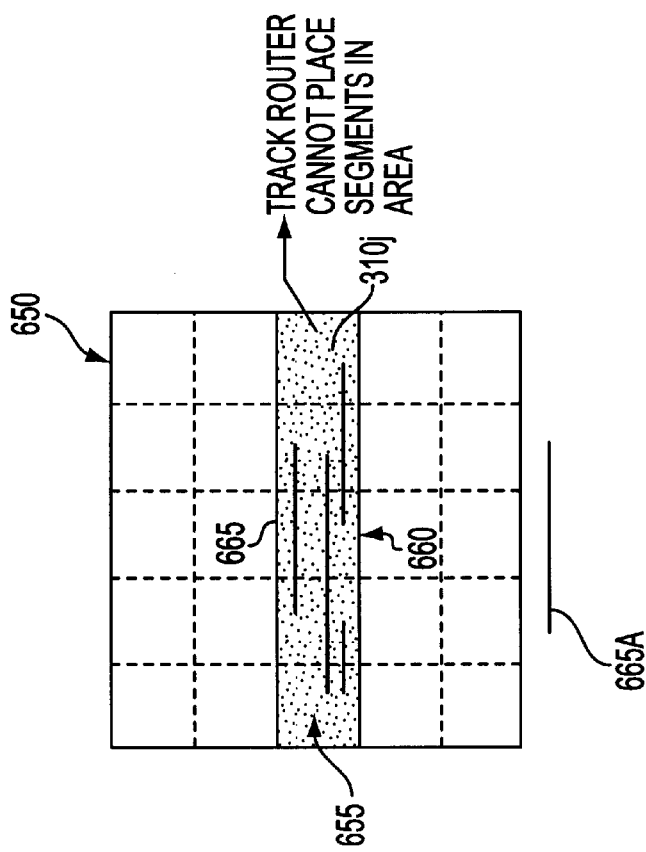
FIG. 11A is a partial top elevational view of an interconnection layer image wherein the track router is unable to place all of the net segments in a given channel.

FIG. 11A is a partial top view of an interconnection layer 650 in a semiconductor die wherein the track router is unable to place all of the net segments 655 in a channel 660. In this example, the net segment 665A will not fit in the channel 660. Some net segments may not fit in their assigned channel if, for example, there are many unfriendly pairs of net segments associated to a channel, thereby forcing the net segments to be spaced at a greater distance. It is difficult to predict the effect that net "unfriendliness" will have on spacing between the net segments.

If certain net segments 655 (such as net segment 665A in FIG. 11A) do not fit, then all buckets 310*j* in the channel 660 are enlarged to create additional space to fit such net segments 665. In FIG. liB, for example, the buckets 310*j* in the channel 660 have been extended in the direction of arrow 670 so that net 665A will fit within the intended bucket. As discussed below, bucket enlargement is performed during the bucket equalization step 232 (FIG. 2).

Bucket Equalization

Prior to the electrical optimization step 220 (FIG. 2), cells are associated to the buckets 310 by the coarse placer wherein the sizes of all buckets 310 are equal. This is shown in FIG. 12A wherein an interconnection layer region 700 includes equal sized buckets 310. During the electrical optimization step 220 and/or track routing step 230 (FIG. 2), the contents assigned to some buckets may change or the sizes and relative positions of the contents may change. Thus some of the bucket sizes may also change. As stated previously in step 220 (FIG. 2), electrical optimization may lead to an increase in the sizes of some cells which are assigned to given buckets. As also stated above, the widths of and the spacing between net segments may change due to capacitance budgets or electrical constraints. As a result some buckets may need to be increased, and thus some buckets may become larger in size than other buckets, and this is shown as bucket equalization step 235 in FIG. 2. Typically, the size of a given bucket which has increased in size will not exceed another bucket in size by more than about 5%. Ideally, however, all buckets should essentially have the same size, since the total layout size of the integrated circuit will be determined by the largest bucket in each of the rows (or in each of the columns).

FIG. 12B shows a bucket array wherein some of the bucket sizes are changed, resulting in a larger circuit. If the bucket 310*k* is the largest bucket in the row 710, it will determine the size (width) of the row 710. If the bucket 310*l* is the largest bucket in the column 720, it will determine the size (width) of the column 720. Thus, the largest bucket in a given row (or given column) will have an impact on the size of the chip.

The largest bucket (or buckets) in a given row (or given column) may include a "critical area", which is shown in FIG. 12C as area 735, which critical area is the difference in area between that bucket and the next largest bucket in a row or column direction. The bucket equalization step 235 minimizes the critical areas in the bucket array so as to optimize the size of the chip. The result of the bucket equalization step 235 is shown in FIG. 12C. The "overflow cells" are moved (assigned) next to neighboring cells so as to reduce the size of the largest bucket in a given row 710 (or given column 720), thereby minimizing the critical area.

Preferably, only "non-critical" cells are moved to a given neighboring bucket, such that the electrical characteristics of the nets will not change or will change as little as possible. Non-critical cells are cells which can be moved without increasing the associated net lengths in a manner that substantially adversely affects timing constraints. A non-critical cell may also drive a given net which is within the net capacitance budget. The non-critical cell can be moved, since the resulting increase in net length still falls within the net capacitance budget. If the electrical characteristics of the altered nets are kept within the capacitance timing budgets, it will be unnecessary to again perform the electrical optimization step 220 (FIG. 2). Re-performing the electrical optimization step 220 would lead to an undesirable loop, since this would change the track routing criteria performed in the track routing step 230.

Additionally, a greedy algorithm may be used when performing the bucket equalization step 235.

Re-Perform the Steps of Global Routing, Net Capacitance Budgeting, and Track Routing The bucket equalization step 235 (FIG. 2) will change the position of cells, thereby changing the global routing and detailed routing data. As a result, the global routing and track routing steps will have to be re-performed. The global routing step is again performed (step 240 in FIG. 2) to incrementally change the circuit and is subject to the following constraints. First, only the topologies of the affected "non-critical" nets are changed, wherein a non-critical net is one which falls within its capacitance budget. Second, all nets remain within their strict capacity criteria. These capacities are the net capacitive load requirements so that the total net topology is likely to meet the timing requirements of the circuit (wherein timing requirements have been fixed in step 220 of FIG. 2). The above constraints minimize the extent of the changes when global routing is again performed. Thus, the topology of most nets in the circuit will remain unchanged.

Additionally, the global routing step 240 (as well as the track routing step 230) are driven by the timing constraints which have been established in the optimization step 220. Thus, global routing is performed so that the net capacitive load requirements are met, thereby permitting circuit timing requirements to be met.

On the other hand, after the net capacitance budgeting step 225 is re-performed, the track routing step 230 is completely re-performed, as it is not possible to incrementally change the track routing of the circuit.

Detailed Placement

Unlike conventional design processes, in the present invention the detailed placement step 245 (FIG. 2) is performed after the track routing step 230. Thus, the invention permits the option of adjusting the placement of cells based on where the global routes are placed. In contrast, under conventional approaches, the net routing typically needs adjustments based on cell placement results.

Figure 13:
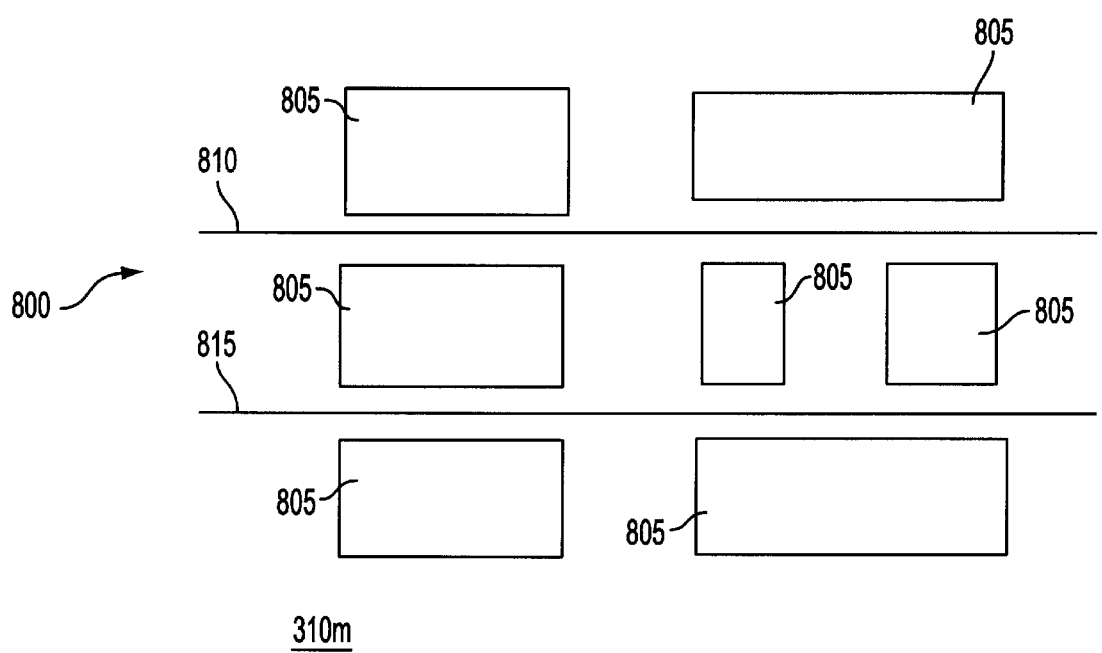
FIG. 13 is a top elevational view of a A placement in a portion of a bucket wherein the cells are placed close to the global routes and are oriented appropriately in the bucket portion.

Under the detailed placement step 245 (FIG. 2), standard cells are assigned final positions. FIG. 13 shows an example of a placement 800 in a portion of a bucket 310*m* wherein the cells, generally shown as 805, are placed close to the net segments 810 and 815 and are oriented appropriately in the bucket portion. General placement techniques known those skilled in the art are used. Such general placement techniques for placing cells in the bucket include min-cut, simulated annealing, and quadratic placement.

The detailed placement step 245 can be performed by a detailed placer based on a conventional algorithmic engine. The detailed placer places cells 805 in one bucket at a time, and may work on two adjacent bucket portions so that proper connections (between cells 805 in adjacent bucket regions) will result from the design process. One objective of the detail placer is to minimize the total net length in the circuit and to possibly minimize the length of a limited set of "critical nets" wherein the critical nets are defined as nets close to their capacitance budgets. Preferably, the detailed placer is also subject to a "net alignment constraint" whereby the detailed placement is adapted based on the track routing step 230 (FIG. 2) output. In other words, the detailed placement of cells is guided by the positions of the global routes as fixed in the. track routing step 230. Net alignment constraints can be taken into account by use of the simulated annealing method. In contrast, conventional approaches attempt to complete the global routes based on the results of the detailed placement.

Pre-placed cells can be taken into account during detailed placement by de-activating certain resources available to the detailed placer. Simulated annealing can take into account the pre-placed cells.

The detailed placement step 245 is performed after the track routing step 230 for the following reasons. First, it is more important to control the net capacitance than to minimize the area of the integrated circuit. Performing the placement step 245 after the track routing step 230 will lessen the difficulty in controlling the net capacitance (since final placement does not yet exist as track routing is performed). Second, as discussed above, the track routing step 230 may unpredictably stretch a row (or columns) of buckets, thereby changing the bucket shapes and sizes (see, e.g., FIG. 11A–11B). In contrast, the detailed placer has very predictable limits and will make changes which will not require the re-performing of global routing (as in step 240). Third, iteration will be much faster in the bucket equalization loop (steps 232, 235, 240, 225 and 230) if the final placement does not yet exist in the circuit. A faster bucket equalization loop lead to a faster design process. Fourth, the detailed placement step 245 can be performed in a very small "window" which is smaller than the track routing step 230 "window" wherein a detailed placement window is a single bucket. This has an advantage of enabling a faster design process.

Figure 14:
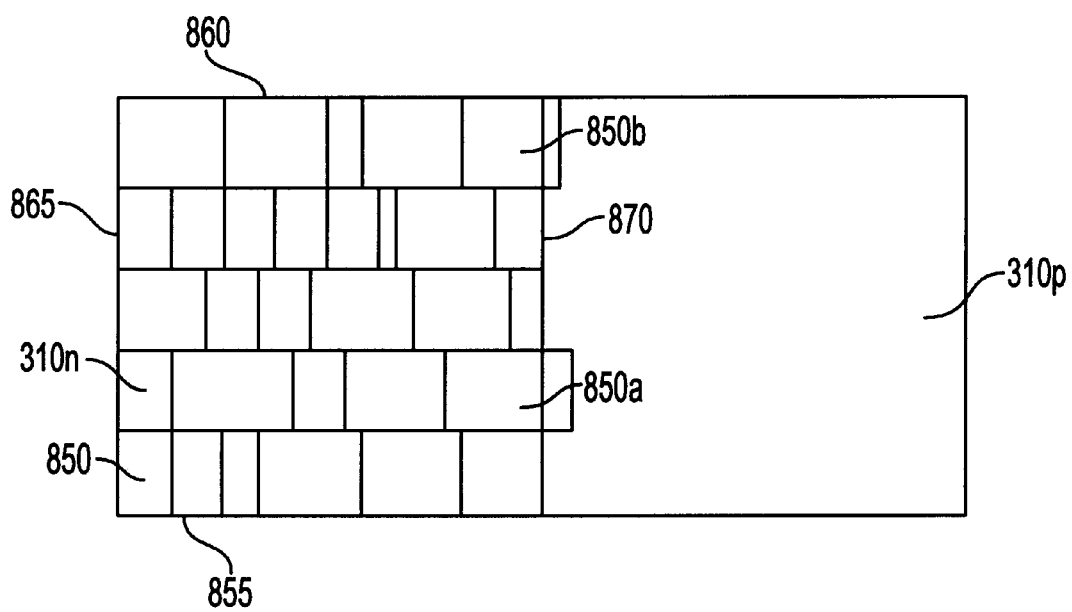
FIG. 14 is a top elevational view of buckets wherein some standard cells in one bucket overlap into the other bucket since some of the standard cells have variable widths.

Reference is now made to FIG. 14 wherein a particular bucket 310 has standard cells which are generally shown as 850. The bucket 310n has clearly defined boundaries on the bottom side 855 and top side 860. The bottom side 855 and the top side 860 coincides with the horizontal power lines of the circuit. Since some standard cells 850 have variable widths, some cells may overlap the left side 865 and/or right side 870. In the example of FIG. 14, the cells 850a and 850b unavoidably overlap the right side 870 and into the neighboring bucket 310p. This overlapping of cells is not a problem if there is never a stretching of the vertical channels on the left or right sides 865 and 870. Pushing a global pin (cell terminal) over the boundary could invalidate the track and global routing and should therefore be preferably avoided.

Detailed Routing

In step 250 (FIG. 2), detailed routing is performed by a detailed router which has a primary objective of achieving routing completion of the circuit and a secondary objective of minimizing any additional load on the critical nets (i.e., nets close to their capacitance budgets). The detailed router generates the local wiring in a given bucket (or a small collection of given buckets). Since the cell sizes and positions have been fixed during the detailed placement step 245 (FIG. 2), the integrated circuit's performance will depend on the detailed routing of step 250.

The detailed router generates the local wiring in each bucket (or in a small collection of buckets) based on its reading of existing routes (e.g., pre-routes and net segments formed during the track routing 230) and of the net list. The output of a detailed router is a mask pattern suitable for a specific VLSI fabrication technology. The detailed routing step 250 will preferably use a grid-based approach. Grid-based routers are simple, sturdy, tested and can enforce a desirable vertical alignment between the interconnection layers. An example of a grid-based router is the conventional Lee-type maze router. The Lee-type maze router is an "over-the-cell" router which uses all available routing resources. The router must be adapted to handle the three-dimensional fine grid. This is accomplished by adapting the wave-front expansion in the Lee router engine.

Although the minimum spacing and width requirements for nets might not be uniform over the different interconnection layers, it can be assumed that a fine grid still allows efficient routing in all of the interconnection layers, since the process design rules are generally targeted towards a grid. In other words, existing design rules are adapted so that a single fine grid can be applied to all of the interconnection layers, thereby permitting the vertical alignment of grids for each layer.

Preferably, the router is adapted to handle a three-dimensional fine grid (e.g., ½ of the normal track pitch (wherein the track pitch is the distance between adjacent tracks 915, measured in a direction perpendicular to the tracks 915). By doubling (or increasing) the resolution of the grid, the relevant deep sub-micron requirements of the integrated circuit can be incorporated. These deep sub-micron requirements relate to, for example, minimizing cross-talk between nets. As stated previously, cross-talk is caused by the capacitive coupling between neighboring nets.

Figure 15:
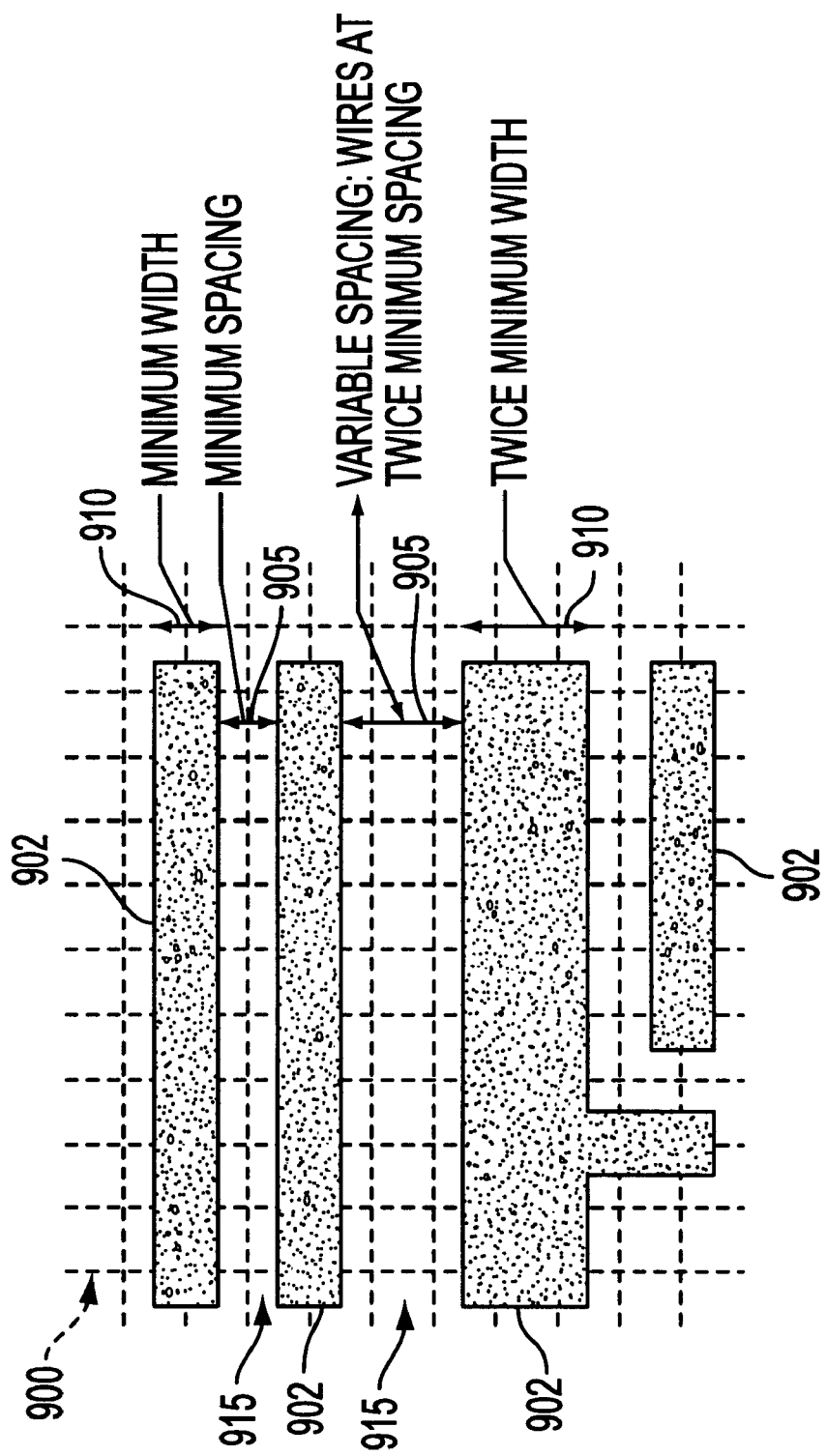
FIG. 15 is a top elevational view of a fine grid which serves to guide detailed routing in each of the buckets.

In FIG. 15, the grid is represented by the lines 900 and the nets are generally shown as 902. In a 0.25 micron CMOS process, the minimum routing pitch (grid spacing) is about 1.0 micron. The use a fine grid allows the detailed router to vary the net spacing (represented by arrows 905) and the net widths (represented by the arrows 910). The net spacing and width can be varied without use of a whole track which generally shown as 915. This approach does not require extra memory, as the encoding per grid point can be reduced.

The net resistance can be varied by adjusting the net width 910. The net resistance decreases linearly as the width 902 increases. The net capacitance can be varied by adjusting the distance 905 between the nets 902. The capacitance of a net decreases linearly (as an approximation) as the distance 905 increases. To fine tune the resistance and capacitance of a net, it is necessary to have a fast and reasonably accurate net extraction capability. The net width and capacitance can be passed as constraints to the detailed router.

It is an option that the detailed router be "capacitance driven" wherein the capacitance-driven router takes into account the maximum capacitive load of a net before generation of the net. This option may not be required since the integrated circuit is already configured to meet the capacitance load requirements in the track routing step 230 (FIG. 2).

The routing area in a bucket is small, for example, 10×10 cells, which is about 200×200×5=200,000 fine grid points.

Routing Completion

If routing completion is achieved, then the layout is generated as an output in step 255 (FIG. 2). However, if the detailed router is unable to achieve routing completion, the following options are available for the circuit designer for routing completion (step 254 in FIG. 2). First, routing completion can be attempted by the router by use of "rip-up-and-reroute strategies". Second, existing nets can be "pushed aside" to correct for wrong decisions made earlier in the design process which led to the incomplete routing.

As a third option for achieving routing completion, the detailed placement step 245 can be re-performed such that the new placement will enable routing completion. According to the present invention, this option can be performed quickly and efficiently, since the placement of cells occurred after the global routing step (215 or 240) and after the track routing step 230. In contrast, in conventional approaches, the global routing step occurs after the cells are placed (see, e.g., U.S. Pat. No. 5,483,461, issued to Lee et al. on Jan. 9, 1996). Thus, in conventional approaches, by re-performing the cell placement step, the global routing step will have to be performed again.

Figure 16A:
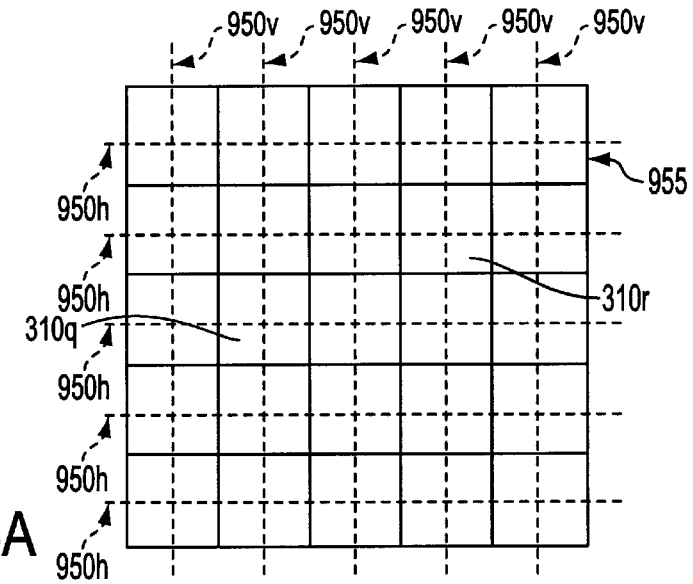
FIG. 16A is a top elevational view of a bucket array and tear lines which can be formed in the bucket array to create additional space for routing.

With reference to FIG. 16A, there is seen another method for achieving routing completion and for meeting capacitance constraints by use of tear lines (generally illustrated as horizontal tear lines 950*h* and vertical tear lines 950*v*). The tear lines are torn in a chip layout 955 by a conventional chip tear line tool such that additional routing spaces are created in the chip. To assist in describing this feature of the invention, only one horizontal tear line 950*h* is shown to span each bucket 310. As best illustrated in FIG. 17, however, a plurality of tear lines 950*h* may span a given bucket, since a chip layout may contain natural tear lines coinciding with the horizontal power nets.

Figure 16B:
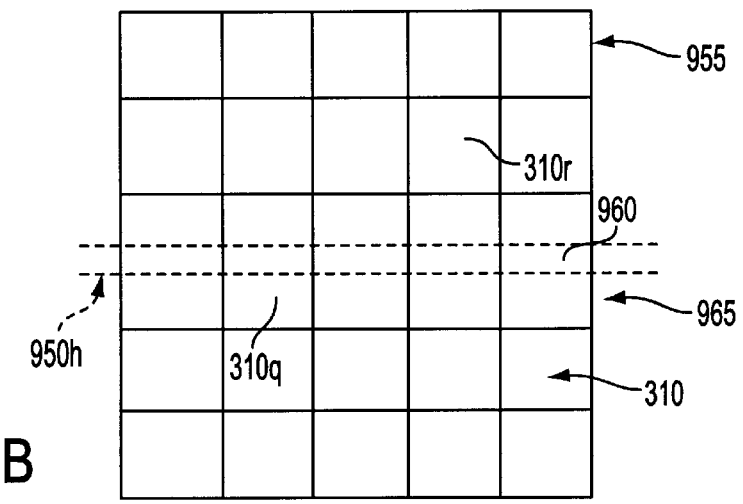
FIG. 16B is a top elevational view of the bucket array of FIG. 16A whereby a tear line is created along a row of buckets to form additional routing space for achieving routing completion for a portion of the circuit.

Referring back to FIGS. 16A–16C, assume that the buckets 310*q* and 310*r* initially have incomplete routing. In FIG. 16B, a chip layout 955 is torn open along the horizontal tear line 950*h* which is across the bucket 310*q*. This creates the additional space 960 which will enlarge all buckets 310 in the row 965, including the bucket 310*q*. Nets which will complete the routing in the bucket 310*q* are placed in the additional space 960. The routing and layout of the buckets, which are not in the row 965, are unaffected by the creation of the additional space 960. Similarly, in FIG. 16C the chip layout 955 is torn open along the vertical tear line 950*v* which is across the bucket 310*r*. This creates the additional space 970 which will enlarge all buckets 310 in the column 975, including the bucket 310*r*, and nets for achieving routing completion can be placed in the additional space 970

Figure 16C:
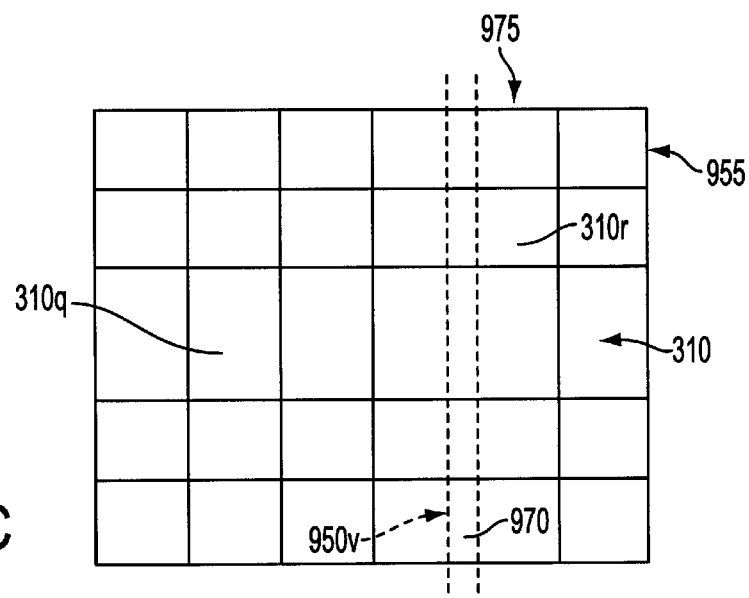
FIG. 16C is a top elevational view of the bucket array of FIG. 16B whereby a second tear line is created along a column of buckets to form additional routing space for achieving routing completion for another portion of the circuit.

As shown in FIGS. 16B and 16C, tearing open the chip layout along a tear line will enlarge all buckets in a row (or column). Although tearing open the chip layout will increase the area of the integrated circuit, the created additional space (e.g., space 960) is utilized for routing completion. In contrast, the conventional methods of achieving routing completion not only enlarges the area of the circuit, but also the additional area added are in portions which are not required in the circuit.

Figure 17:
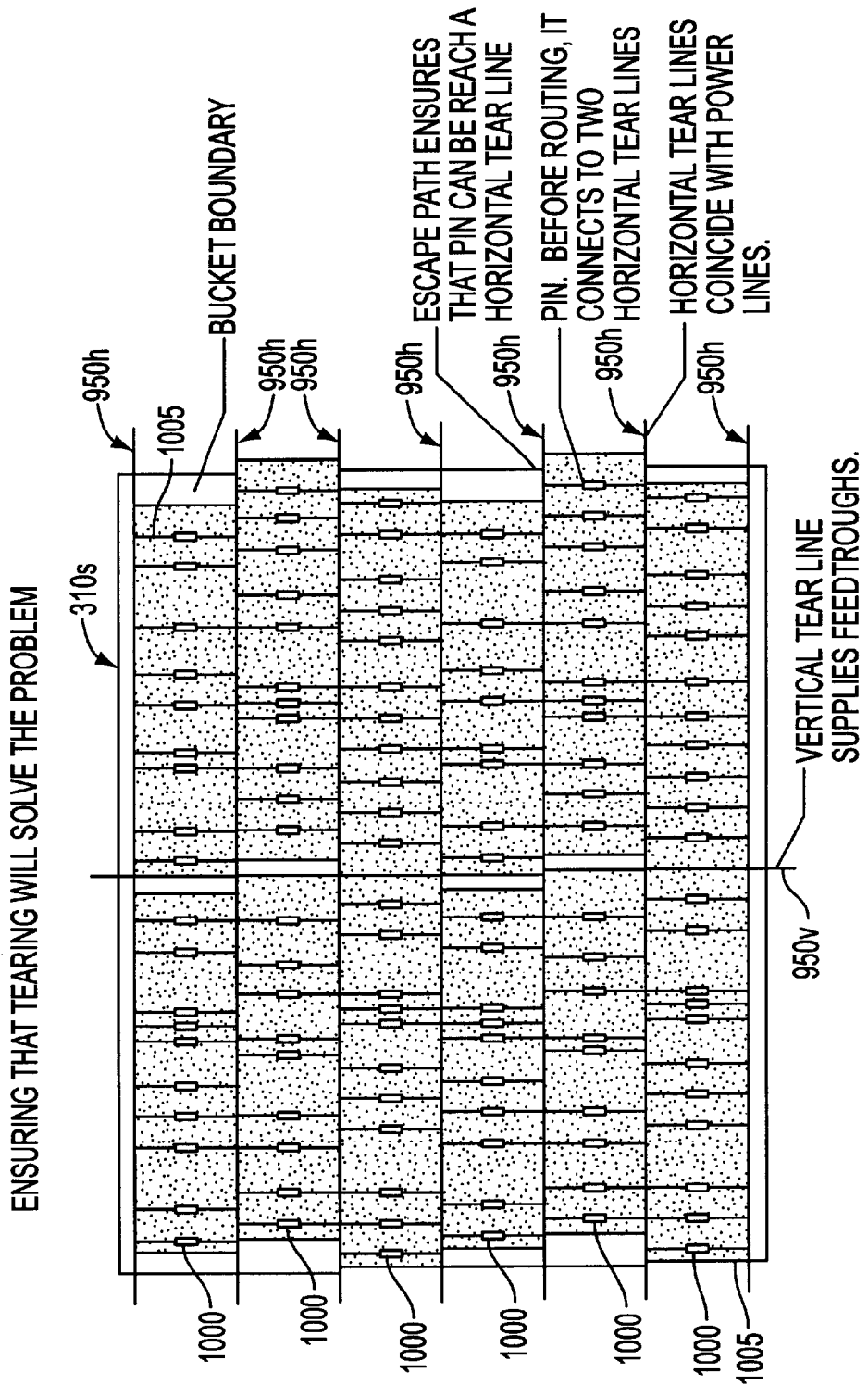
FIG. 17 is a top elevational view of a given bucket showing a plurality of tear lines and escape paths which can be formed in a bucket to achieve routing completion.

Reference is now made to FIG. 17 which shows a bucket 310*s* for the purpose of illustrating the method for achieving routing completion by use of tear lines. According to the present invention, pins (cell terminals), generally illustrated as 1000, are placed adjacent to a given tear line 950*h*. All pins 1000 are connected to the nearest tear line 950*h* by using an "escape path" (generally illustrated as 1005) wherein an escape path is a temporary wire or conductor which connects a given cell terminal 1000 to two horizontal tear lines 950*h* which are adjacent the given cell terminal 1000. The escape paths 1005 are removed as soon as a net is routed over the cell terminal, thereby achieving routing completion.

Figure 18:
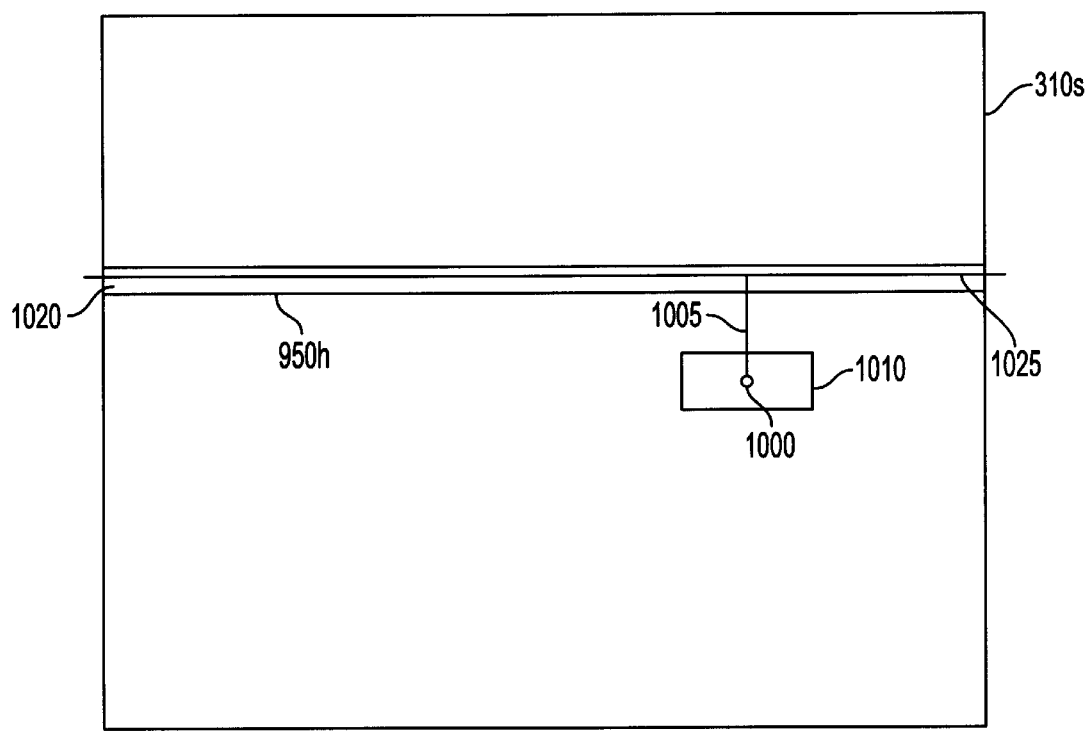
FIG. 18 is a top elevational view of a given bucket showing the achievement of routing completion for the circuit by coupling a cell terminal to a net which is formed in the tear line.

Referring now to FIG. 18, assume that a given cell 1010 has a terminal 1000 which can be coupled to a given tear line 950*h* via escape path 1005 and that routing completion has not been achieved for the terminal 1000. Assuming further that the chip layout is torn open at the tear line 950*h* to create additional space 1020. At least one net 1025 may be placed in the additional space 1020, and the terminal 1000 may be coupled to the net 1025 to achieve routing completion.

Figure 19:
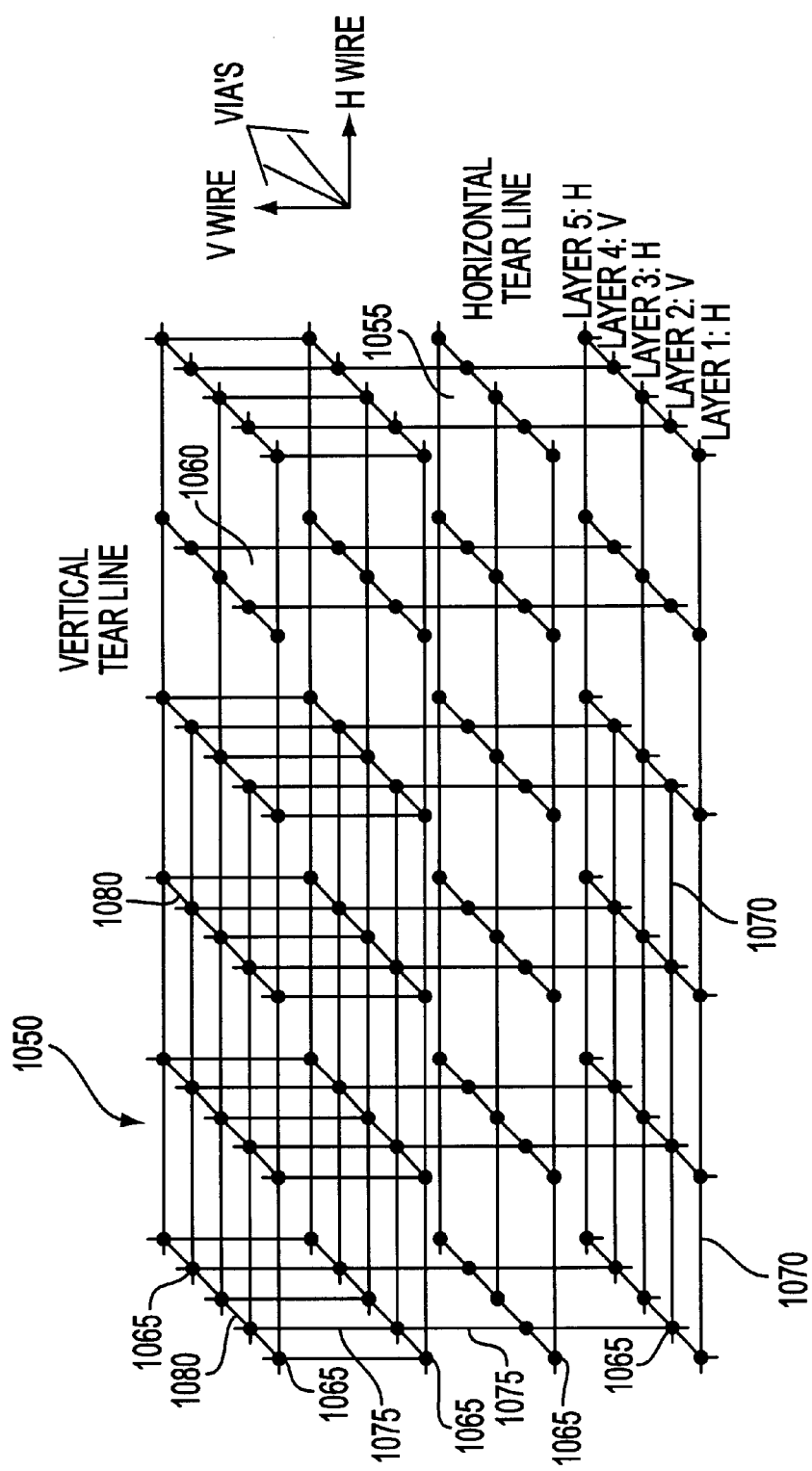
FIG. 19 is a perspective view of a portion of the routing grid at the intersection of two tear lines wherein the routing grid is sparse at the tear lines.

FIG. 19 is a snapshot of a routing grid 1050 at the intersection of two tear lines (horizontal tear line 1055 and vertical tear line 1060). The routing grid 1050 is the "in-core" representation of the routing environment in a chip layout, and is a three-dimensional near-regular mesh of nodes (generally represented by the dots 1065). The horizontal edges 1070 and the vertical edges 1075 represent segments of nets. The edges 1080 (along the z-direction) represent vias for connecting a net in one interconnection layer to another net in structure can be hidden from the detailed router by embedding the tear line structure in the routing grid as best shown in FIG. 19. The horizontal tear lines are crossed by vertical layers and vertical tear lines are crossed by horizontal layers.

The three-dimensional fine grid 1050 in FIG. 19 is configured so as to minimize the routing of the detailed routes along the tear lines of the chip layout. The cost factors are tuned such that routing along the tear lines 1055 and 1060 will be extremely expensive. If the cost of an edge (e.g., tear line) is high, then the detailed router will unlikely use the edge. If routing completion is not achieved, then the detailed router will consider the use of the tear line so that the chip layout is torn open to provide additional spaces for routing. Thus most nets will be routed over the cells. If a given connection cannot be made, then the detailed router will consider using the tear line for routing completion.

While it is preferred to stay within the timing constraints during steps 225–250, it is within the scope of the present invention to go beyond the timing constraints and to subsequently determine whether to correct the circuit later in the design process to meet the timing constraints (as fixed in step 220).

The integrated circuit chip resulting from the method of the present invention may have, for example, 1,000,000 cells and 1,000,000 nets. Each cell measures 10×10 routing tracks and has three inputs and one output. In one preferred embodiment of the invention, the chip is configured in an array of 1,000×1,000 cells which, in turn, translates to 10,000×10,000 tracks (or 1×1 cm). In addition, a row-based standard cell style layout is preferably implemented.

This specification shows the components (e.g., buffers, cells, nets) which exist when the integrated circuit layout is produced. However, it is realized by those skilled in the art that when performing the steps in accordance with the present invention prior to producing the layout, the shown components are data representation stored in the computer and not the actual devices.

Thus, while the present invention has been described herein with reference to particular embodiments thereof, a latitude of modification, various changes and substitution are intended in the foregoing disclosure, and it will be appreciated that in some instances some features of the invention will be employed without a corresponding use of other features without departing from the scope of the invention as set forth.

What is claimed is:

1. An automated method for designing an integrated circuit layout with a computer, based upon an electronic circuit description and upon a selected plurality of cells from a cell library, comprising the steps of:

(a) assigning each of the cells to one of a plurality of buckets designated on the integrated circuit layout, each of the cells being connected to one of the other cells;

(b) performing global routing to connect at least some of the selected cells of step (a) together such that global routes are formed to provide net topology information;

(c) performing track routing which sets the position of each of the global routes;

(d) performing detailed placement.such that the positions of all selected cells are fixed within each of the buckets designated on the integrated circuit layout; and (e) performing detailed routing such that detailed routes are formed to complete the integrated circuit layout.

2. The automated method of claim 1 further comprising:
prior to the step (b) of performing global routing, performing global optimization of cell sizes based upon the assignment of each of the cells of step (a).

3. The automated method of claim 1 wherein the step of performing global optimization includes reducing a logic structure formed by at least some the cells of step (a).

4. The automated method of claim 1 further comprising:
performing electrical optimization based upon the net topology information of step (b) to satisfy predetermined timing constraints for at least some of the global routes of step (b).

5. The automated method of claim 4 wherein the step of performing electrical optimization comprises:
adjusting the width of at least some of the global routes of step (b).

6. The automated method of claim 4 wherein the step of adjusting the width of at least some of the global route satisfies electromagnetic constraints of said some of the global routes.

7. The automated method of claim 4 further comprising:
after the step of performing electrical optimization, determining a capacitance load for each of the global routes of step (b) so that the capacitance load of each of the global routes satisfies predetermined timing constraints associated with each of the global routes.

8. The automated method of claim 7 wherein the step (c) of performing track routing sets the capacitance load of each of the global routes of step (b).

9. The automated method of claim 8 wherein the capacitive load for a certain one of the global routes is used to determine the location of another global route.

10. The automated method of claim 7 wherein the step (c) of performing track routing sets the position of each of the global routes to meet predetermined timing constraints associated with each of the global routes.

11. The automated method of claim 1 further comprising:
prior to the step (d) of performing detailed placement, performing bucket equalization to minimize an area of the integrated circuit layout.

12. The automated method of claim 11 wherein the step of performing bucket equalization comprises:
moving one of the cells of step (a) to further reduce the area of the integrated circuit layout.

13. The automated method of claim 12 where the step of moving one of the cells assists in satisfying predetermined timing constraints associated with at least some of the global routes of step (b).

14. The automated method of claim 12 further comprising:
after the step of performing bucket equalization, performing a timing-driven global routing to adjust at least some of the global routes which are connected to the moved cell.

15. The automated method of claim 14 further comprising:
after the step of performing the timing-driven global routing, performing track routing to determine the positions of the global routes of step (b).

16. The automated method of claim 1 further comprising:
achieving routing completion to connect one of the cells in one of the buckets to another one of the cells in the same bucket.

17. The automated method of claim 16 wherein the step of achieving routing completion comprises:
repeating the step (d) of performing detailed placement such that at least some of the cells permit routing completion.

18. The automated method of claim 16 wherein the step of achieving routing completion comprises:
forming a tear line in the chip layout; and
disposing a net in the tear line; and
forming a conductor for coupling one of the cells in one of the buckets to the net disposed in the tear line.

19. The automated method of claim 1 further comprising:
associating a hierarchical module in one of the buckets of step (a).

20. The automated method of claim 1 wherein the number of cells associated within one of the buckets of step (a) ranges from 20 to 200.

21. The automated method of claim 1 further comprising:
providing a hierarchical netlist;
tagging a selected intermediate hierarchical module in the hierarchical netlist;
flattening the hierarchical netlist while preserving the selected intermediate hierarchical module; and
generating a netlist for the step (a) of performing coarse placement if the selected intermediate hierarchical module fits within one of the buckets of step (a).

22. The automated method of claim 21 further comprising:
if the selected intermediate hierarchical module is larger than one of the buckets of step (a), partitioning the selected intermediate hierarchical module into smaller parts; and
selecting wires for coupling the smaller parts together so as to place each of the smaller parts adjacent each other.

23. The automated method of claim 1 wherein the step (a) of performing coarse placement permits violations of predetermined timing constraints associated with the global routes.

24. The automated method of claim 1 wherein the step (d) of performing detailed placement is performed after the step (c) of performing track routing.

25. The automated method of claim 1 wherein the step (b) of performing global routing placement permits violations of predetermined timing constraints associated with the global routes.

26. The automated method of claim 1 wherein the step (c) of track routing includes:
fixing the positions of a first selected plurality of global routes in a generally horizontal direction.

27. The automated method of claim 1 wherein the step (c) of track routing further includes:
fixing the positions of a second selected plurality of global routes in a generally vertical direction.

28. The automated method of claim 1 wherein the final positions for all cells of step (d) is based upon the position of each of the global routes as set in the step (c) of performing track routing.

29. The automated method of claim 1 wherein the step (e) of performing detailed routing generates detailed routes for coupling the cells to the global routes.

30. The automated method of claim 1 wherein the step (e) of performing detailed routing is performed by a maze router adapted for operation on a three-dimensional fine grid.

31. The automated method of claim 30 wherein the resolution of the three-dimensional fine grid can be increased to satisfy deep submicron requirements.

32. The automated method of claim 31 wherein the resolution of the three-dimensional fine grid is adjusted to control the capacitance between the detailed routes.

33. The automated method of claim 32 wherein the three-dimensional fine grid is configured to minimize the routing of the detailed routes along a tear line of the integrated circuit layout.

34. The automated method of claim 1 wherein the step (d) of performing detailed routing generates local routing for each bucket of step (a).

35. The automated method of claim 1 wherein the position of at least some of the global routes are set without vertical constraints during the track routing step (c).

36. An integrated circuit layout produced in accordance with the automated method of claim 1.

37. A method for designing an integrated circuit layout by using a computer, based upon the selection of cells from a cell library, comprising the steps of:
  (a) designating a plurality of buckets in the integrated circuit layout so that at least some of the cells are assigned in initial placements in the buckets;
  (b) connecting a plurality of global routes having net lengths based upon the initial placements of the cells of step (a);
  (c) performing track routing to fix the position of each of the global routes of step (b);
  (d) performing detailed placement by placing additional cells in the buckets of step (a) after the fixing step (c) so that positions of selected cells are fixed within each of the buckets on the integrated circuit layout; and
  (e) placing detailed routes to connect at least some of the additional cells together in one of the buckets.

38. The method of claim 37 further comprising:
performing optimization based upon the initial placements of step (a).

39. The method of claim 38 wherein the step of performing optimization comprises:
partially re-mapping at least some of the cells of step (a) to reduce a logic structure formed by cells of step (a).

40. The method of claim 39 further comprises:
after the step of performing electrical optimization, determining the capacitance budget for each of the global routes of step (b) so that each of the global routes satisfies predetermined timing constraints associated with each of the global routes.

41. The method of claim 37 further comprises:
after performing the connecting step (b), performing electrical optimization to satisfy predetermined timing constraints for at least some of the global routes of step (b).

42. The method of claim 41 wherein the step of performing electrical optimization comprises:
adjusting the widths of at least some of the global routes of step (b).

43. The method of claim 42 further comprising:
based on the step of moving the selected cell, performing global routing to incrementally adjust at least some of the global routes connected to the moved cell.

44. The method of claim 37 further comprising:
after performing the fixing step (c), moving a selected one of the cells in an incremental distance to minimize an area of the integrated circuit layout.

45. The method of claim 37 wherein the step (e) of placing detailed routes satisfies the predetermined timing constraints associated with each of the global routes of step (c).

46. The method of claim 37 wherein the detailed routes of step (e) are placed by a grid-based router.

47. The method of claim 46 wherein the grid-based router is adjusted to meet deep submicron requirements.

48. The method of claim 37 wherein the detailed routes of step (e) are placed to assist in satisfying capacitance load requirements associated for each of the detailed routes.

49. The method of claim 37 further comprising:
after the placing step (e), performing routing completion so as to complete the integrated circuit layout.

50. The method of claim 49 wherein the step of performing routing completion comprises:
re-performing the placing step (d) to generate another placement for the additional cells of step (d) to enable routing completion of the integrated circuit layout.

51. The method of claim 49 wherein the step of performing routing completion comprises:
forming a space in the integrated circuit layout for receiving a wire which enable routing completion.

52. The method of claim 51 wherein the additional space is a tear line in the integrated circuit layout.

53. The method of claim 51 further comprising:
forming a conductor for coupling a cell in one of the buckets of step (d) to the wire in the space formed in the chip layout.

54. The method of claim 37 wherein the initial placement of cells in step (a) permits timing violations in the global routes.

55. The method of claim 37 wherein the connecting step (b) permits timing violations in the global routes.

56. An integrated circuit layout produced in accordance with the method of claim 37.

57. A method for designing an integrated circuit layout, comprising the steps of:
  (a) placing a first plurality of cells in initial positions designated by buckets;
  (b) forming a plurality of global routes based upon the designated initial positions of the first plurality of cells of step (a);
  (c) performing track routing to fix the positions of the global routes of step (b);
  (d) performing detailed placement by placing a second plurality of cells based upon the positions of the global routes of step (c) such that the positions of all selected cells are fixed within the buckets designated on the integrated circuit layout; and
  (e) placing a plurality of detailed routes to complete the integrated circuit layout.

58. The method of claim 57 further comprising:
performing optimization based upon the designated initial positions of the first plurality of cells of step (a).

59. The method of claim 57 further comprising:
after the fixing step (c), performing electrical optimization to satisfy the predetermined timing constraints of at least some of the global routes.

60. The method of claim 57 further comprising:
setting the capacitance of each of the global routes of step (b) prior to the fixing step (c).

61. The method of claim 57 further comprising:
after the fixing step (c), moving at least one of the first plurality of cells at an incremental distance to minimize an area of the integrated circuit layout.

62. The method of claim 61 further comprising:
revising a selected number of global routes coupled to a moved cell after performing the step of moving at least one of the cells.

63. The method of claim 62 wherein the revising step satisfies the predetermined timing constraints associated with at least some of the global routes.

64. The automated method of claim 57 wherein the placing step (e) is based upon a three-dimensional grid for guiding the detailed routes.

65. The automated method of claim 64 wherein the three-dimensional grid can incorporate deep submicron requirements of the integrated circuit layout.

66. The automated method of claim 57 wherein the fixing step (c) is driven by predetermined timing constraints associated with at least some of the global routes.

67. The automated method of claim 57 wherein the placing step (a) permits violations of predetermined timing constraints associated with each of the global routes.

68. The automated method of claim 57 wherein the forming step (b) permits violations of predetermined timing constraints associated with each of the global routes.

69. The automated method of claim 57 further comprising:

performing routing completion to form the integrated circuit layout.

70. The automated method of claim 69 wherein the step of performing routing completion comprises:

re-performing the placing step (d) so that routing completion is achieved after placement of the second plurality of cell.

71. The automated method of claim 69 wherein the step of performing routing completion comprises:

forming a space in the integrated circuit layout;

receiving a wires in the space; and coupling one of the second plurality of cell to the wire formed in the space.

72. The automated method of claim 71 wherein the space is formed by a tear line in the integrated circuit layout.

73. An integrated circuit layout produced in accordance with the automated method of claim 57.

74. An integrated circuit layout formed on a chip layout comprising:

a plurality of selected cells;

global routes for coupling the selected cells together, the global routes having been set in position by a track routing process;

detailed routes for coupling the global routes to the selected cells; and a routing space formed in the chip layout for permitting routing completion of the integrated circuit layout;

wherein the cells are fixed within buckets on the integrated circuit layout by a detailed placement process.

75. The integrated circuit layout of claim 74 wherein the selected cells are sized so as to permit timing constraints of the integrated circuit layout to be met.

76. The integrated circuit layout of claim 74 wherein the global routes are routed so as to satisfy the timing parameters of the global routes.

77. The integrated circuit chip of claim 74 wherein the detailed routes are routed so as to satisfy the timing parameters of the global routes.

78. A timing-based integrated circuit layout formed on a chip layout comprising:

a plurality of cells;

timing-based global routes for coupling at least some of the cells together, the timing-based global routes being set in position by track routing so as to satisfy timing requirements of the integrated circuit layout; and detailed routes for coupling the timing-based global routes to at least some of the cells, the at least some of the cells having been fixed in position within buckets designated on the integrated circuit layout by a detailed placement process.

79. An automated method for satisfying the timing requirements of an integrated circuit layout on a chip layout, comprising the steps of:

(a) placing a first selected plurality of cells in approximate positions in the chip layout;

(b) selecting global routes for coupling the first selected plurality of cells together;

(c) setting the positions of the global routes of step (b) using a track routing process such that a timing parameter of each of the global routes satisfies the timing requirements of the integrated circuit layout; and (d) placing a second selected plurality of cells based upon the positions of the global routes of step (c) using a detailed placement process such that the positions of selected cells are fixed within each of buckets designated on the integrated circuit layout.

80. An integrated circuit layout produced in accordance with the automated method of claim 79.

81. An automated method for achieving routing completion in an integrated circuit layout, comprising the steps of:

(a) providing a first plurality of cells in approximate positions so that the cells are used to implement the integrated circuit layout;

(b) placing a plurality of global routes for coupling the first plurality of cells;

(c) fixing the positions of the global routes using a track routing process;

(d) placing a second plurality of cells based upon the positions of the global routes of step (c);

(e) performing detailed routing for coupling the second plurality of cells together and to the global routes; and (f) performing routing completion so as to form the integrated circuit layout such that positions of all selected cells are fixed within buckets on the integrated circuit layout.

82. The automated method of claim 81 wherein the performing step (e) includes:

forming a tear in a chip layout; and receiving a wire in the tear wherein the wire enables routing completion of the integrated circuit layout.

83. The automated method of claim 82 wherein the tear is formed by a chip tearing device.

84. An integrated circuit layout produced in accordance with the automated method of claim 81.

85. An automated method for designing an integrated circuit layout with a computer, based upon an electronic circuit description and by using a cell library containing a selected plurality of cells, comprising the steps of:

(a) based upon a portion of a computer program that contains a sequence of instructions, assigning each of the cells to one of a plurality of buckets designated on the integrated circuit layout, each of the cells being connected to one of the other cells based upon the electronic circuit description input to the computer;

(b) performing global routing to connect at least some of the selected cells of step (a) together such that global routes are formed to provide net topology information;

(c) performing track routing which sets the position of each of the global routes;

(d) performing detailed placement such that the positions of all selected cells are fixed within each of the buckets designated on the integrated circuit layout; and (e) performing detailed routing such that detailed routes are formed to complete the integrated circuit layout.

86. A automated method for designing an integrated circuit layout by using a computer and based upon an electronic circuit description, comprising the steps of:
    (a) using a portion of a computer program that contains a sequence of instructions, placing a first plurality of cells in designated initial positions;
    (b) forming a plurality of global routes based upon the designated initial positions of the first plurality of cells of step (a);
    (c) performing track routing to fix the positions of the global routes of step (b);
    (d) performing detailed placement on a second plurality of cells based upon the positions of the global routes of step (c) such that positions of all selected cells are fixed in each of buckets designated on the integrated circuit layout; and
    (e) placing a plurality of detailed routes to complete the integrated circuit layout.

* * * * *